United States Patent
Onaka

(10) Patent No.: US 9,325,141 B2
(45) Date of Patent: Apr. 26, 2016

(54) AMPLIFYING APPARATUS AND AMPLIFYING MEDIUM

(71) Applicant: FUJITSU LIMITED, Kawasaki-shi, Kanagawa (JP)

(72) Inventor: Miki Onaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/485,131

(22) Filed: Sep. 12, 2014

(65) Prior Publication Data

US 2015/0002923 A1  Jan. 1, 2015

Related U.S. Application Data

(63) Continuation of application No. PCT/JP2012/058026, filed on Mar. 27, 2012.

(51) Int. Cl.
*H01S 3/067* (2006.01)
*G02B 6/42* (2006.01)
(Continued)

(52) U.S. Cl.
CPC ........ *H01S 3/06704* (2013.01); *G02B 6/02366* (2013.01); *G02B 6/4268* (2013.01); *H01S 3/042* (2013.01); *H01S 3/06754* (2013.01); *H01S 3/094011* (2013.01); *H01S 3/1028* (2013.01); *H01S 3/1603* (2013.01); *H01S 3/0078* (2013.01); *H01S 3/0405* (2013.01); *H01S 3/06741* (2013.01); *H01S 3/06758* (2013.01); *H01S 3/09415* (2013.01); *H01S 3/1608* (2013.01); *H01S 5/02248* (2013.01);
(Continued)

(58) Field of Classification Search
CPC .............. H01S 3/0405; H01S 3/06704; H01S 3/06754; G02B 6/02314; G02B 6/02342; G02B 6/02366; G02B 6/4268
See application file for complete search history.

(56) References Cited

U.S. PATENT DOCUMENTS 7,957,623 B2 * 6/2011 Panarello et al. ............. 385/134
2006/0263024 A1 * 11/2006 Dong et al. ................... 385/125
(Continued)

FOREIGN PATENT DOCUMENTS

JP  04-011794  1/1992
JP  10-223960  8/1998
(Continued)

OTHER PUBLICATIONS

International Search Report mailed Apr. 24, 2012 in corresponding International Application PCT/JP2012/058026.
(Continued)

*Primary Examiner* — Eric Bolda
(74) *Attorney, Agent, or Firm* — Staas & Halsey LLP

(57) ABSTRACT

An amplifying apparatus includes an optical fiber that includes a wound portion doped with a rare earth element and three-dimensionally wound, holes being formed in cladding of the optical fiber and surrounding a core of the optical fiber, the optical fiber transmitting signal light injected thereinto; a thermally conductive member in which the wound portion of the optical fiber embedded, the thermally conductive member having thermal conductivity; a light source that emits excitation light; an injecting unit that injects the excitation light emitted by the light source, into the optical fiber; and a temperature adjusting unit that includes a thermal coupling unit thermally connected to the light source and the thermally conductive member, the temperature adjusting unit adjusting a temperature of the thermal coupling unit.

12 Claims, 28 Drawing Sheets

(51) Int. Cl.
- H01S 3/04 (2006.01)
- H01S 3/094 (2006.01)
- G02B 6/02 (2006.01)
- H01S 3/102 (2006.01)
- H01S 3/16 (2006.01)
- H01S 3/042 (2006.01)
- *H01S 3/0941* (2006.01)
- *H01S 5/022* (2006.01)
- *H01S 5/024* (2006.01)
- *H01S 3/00* (2006.01)
- *H01S 5/0683* (2006.01)

(52) U.S. Cl.
CPC ........ *H01S 5/02284* (2013.01); *H01S 5/02415* (2013.01); *H01S 5/02438* (2013.01); *H01S 5/02469* (2013.01); *H01S 5/0683* (2013.01)

(56) References Cited

U.S. PATENT DOCUMENTS

| | | |
|---|---|---|
| 2007/0189340 A1 | 8/2007 | Hongo et al. |
| 2007/0201518 A1* | 8/2007 | Rothenberg et al. ............... 372/6 |
| 2007/0206909 A1* | 9/2007 | Wetter et al. .................... 385/92 |
| 2010/0074586 A1 | 3/2010 | Panarello et al. |
| 2012/0155498 A1 | 6/2012 | Sakamoto |
| 2013/0016743 A1* | 1/2013 | Tanaka et al. .................... 372/6 |

FOREIGN PATENT DOCUMENTS

| | | |
|---|---|---|
| JP | 2002-277665 | 9/2002 |
| JP | 2007-214431 | 8/2007 |
| JP | 2009-129987 | 6/2009 |
| JP | 2010-215458 | 9/2010 |
| JP | 2010-263026 | 11/2010 |
| WO | 2006/098313 | 9/2006 |
| WO | 2011/102378 | 8/2011 |

OTHER PUBLICATIONS

PCT International Preliminary Report dated Oct. 9, 2014 in corresponding International Patent Application No. PCT/JP2012/058026.

Japanese Office Action dated Jul. 28, 2015 in corresponding Japanese Patent Application No. 2014-507109.

Chinese Office Action mailed Feb. 16, 2016 in corresponding Chinese Patent Application No. 201280071672.0.

* cited by examiner

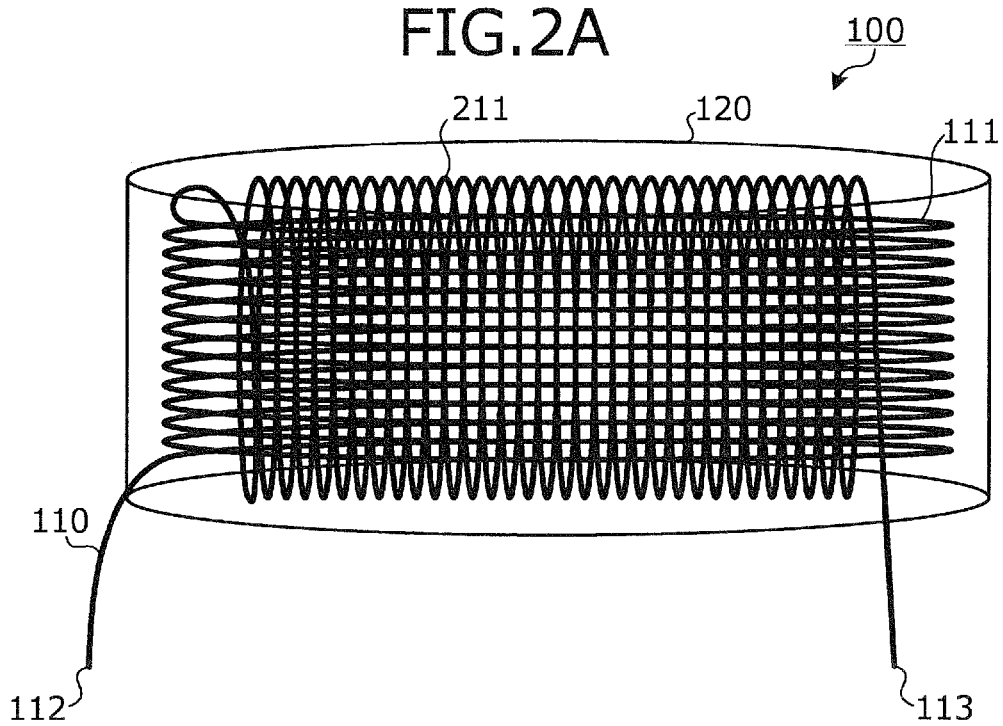

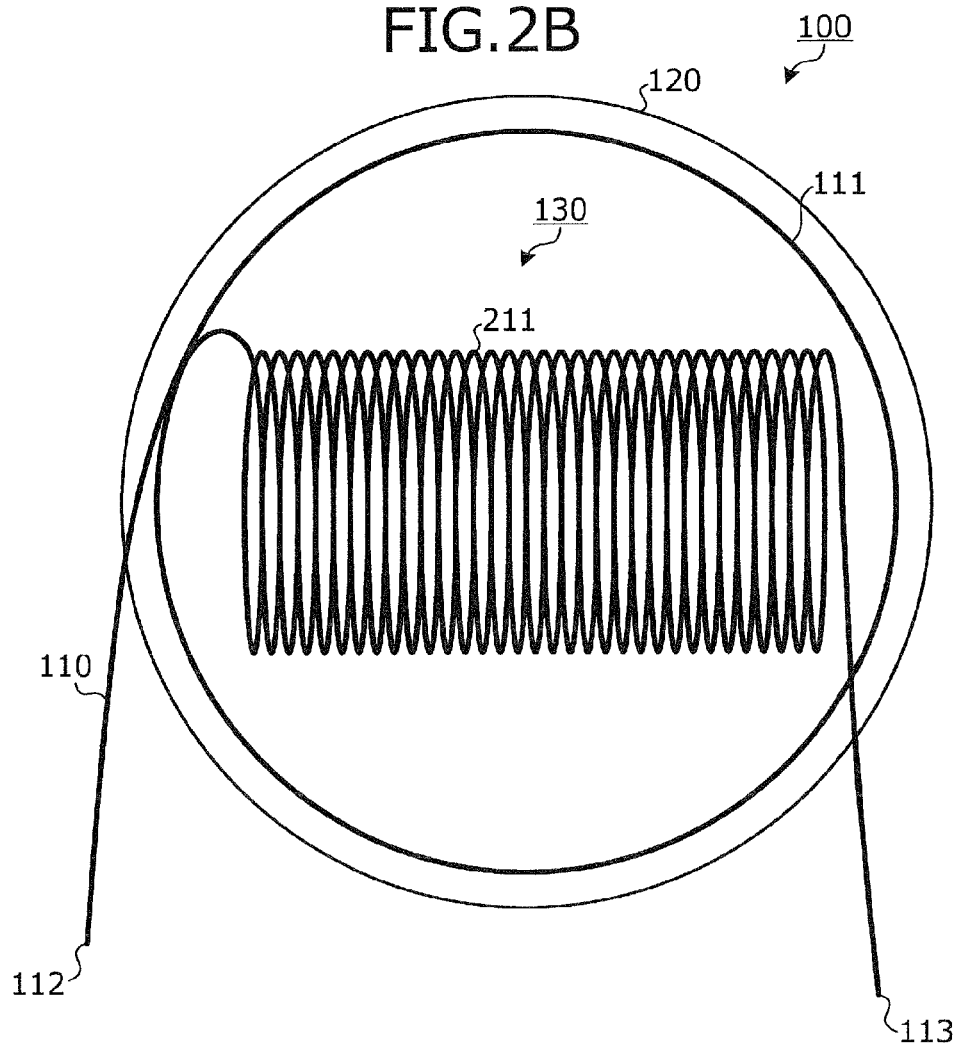

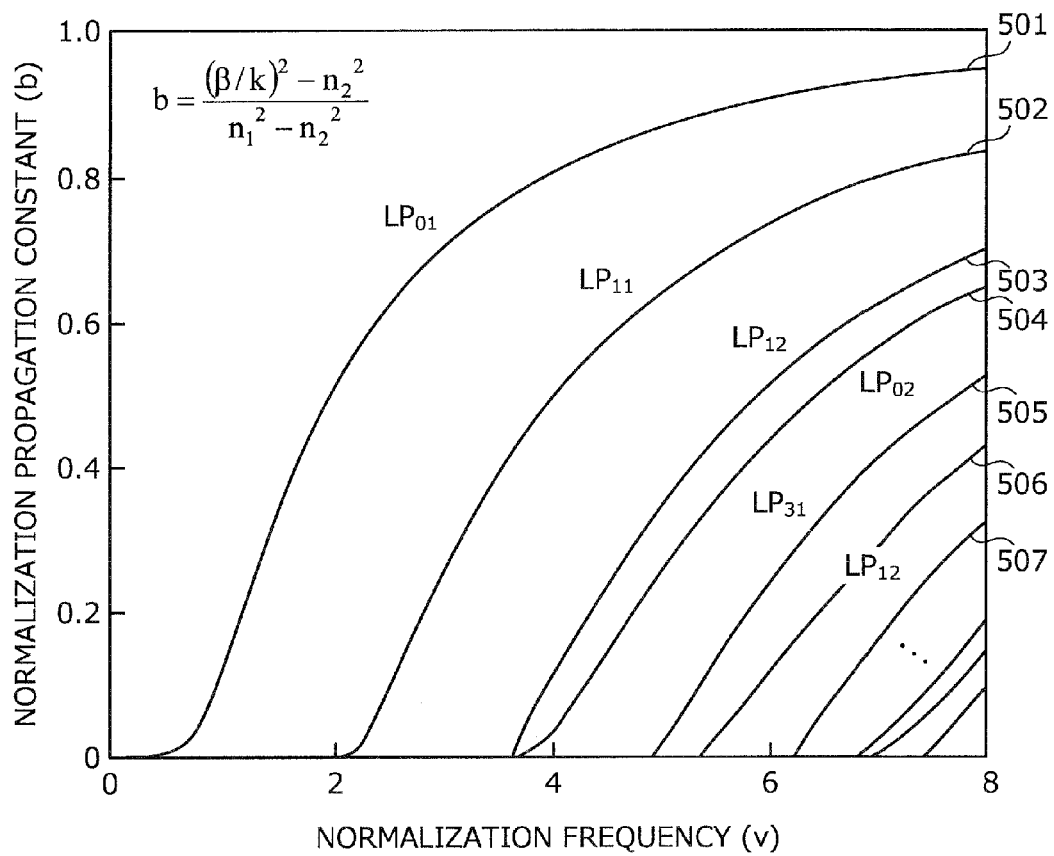

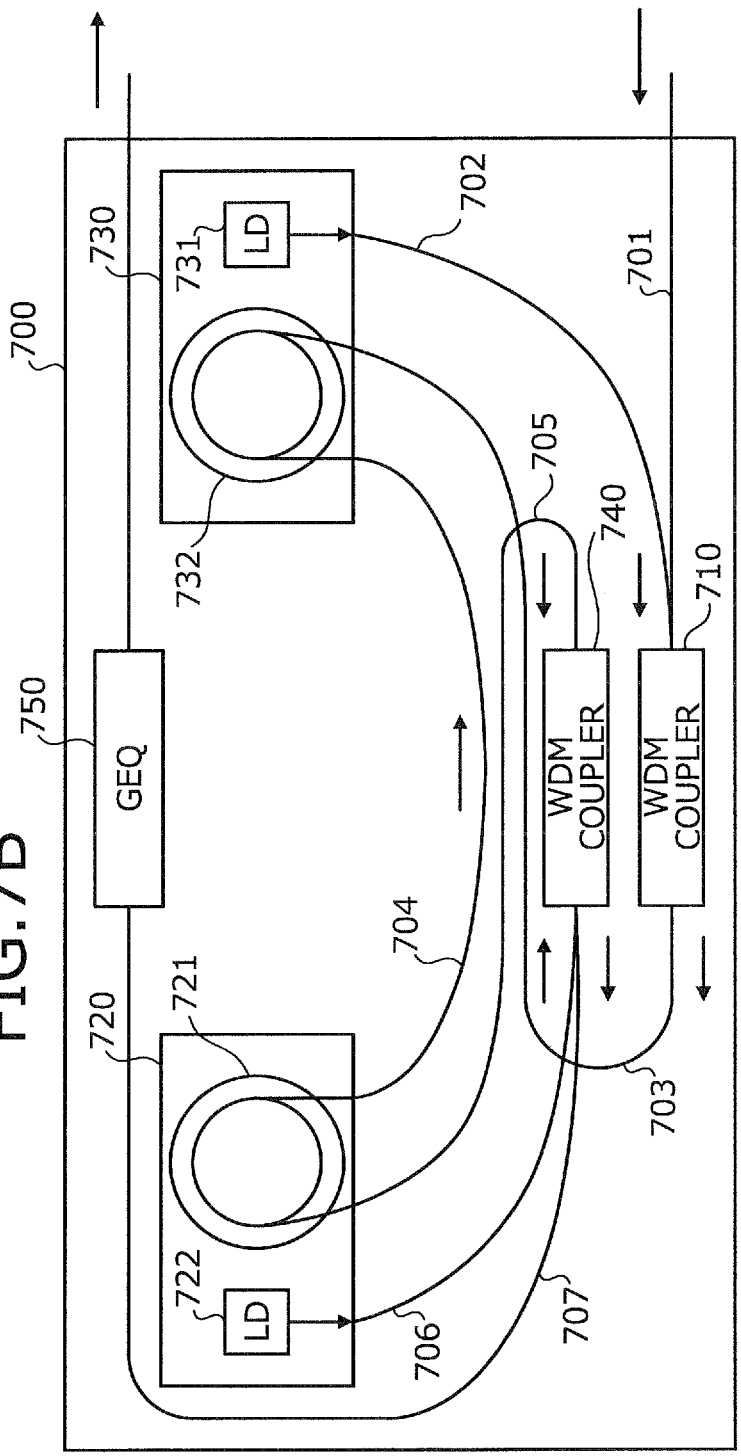

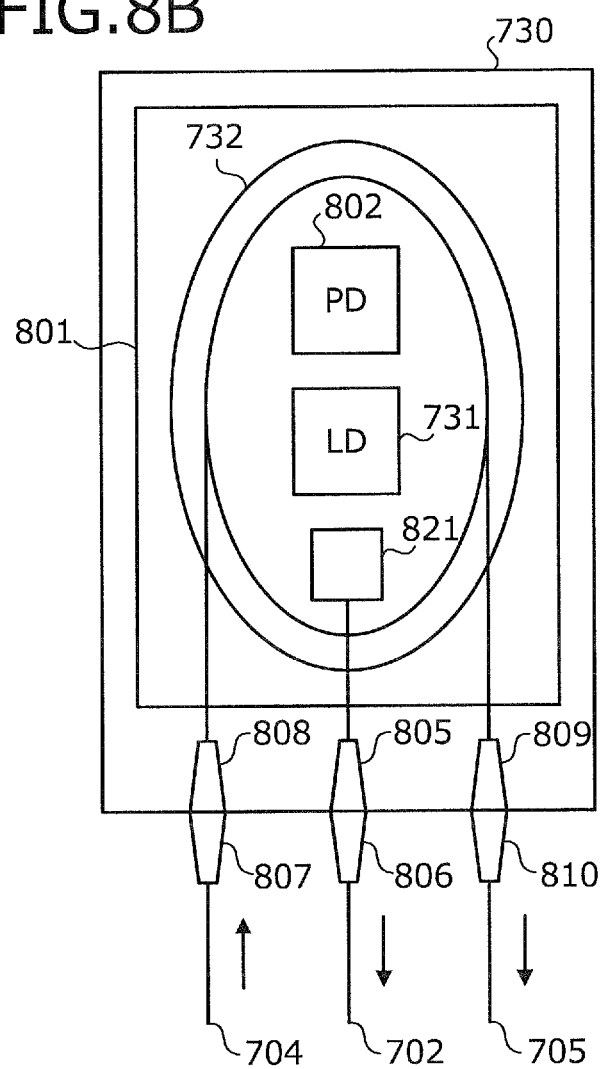

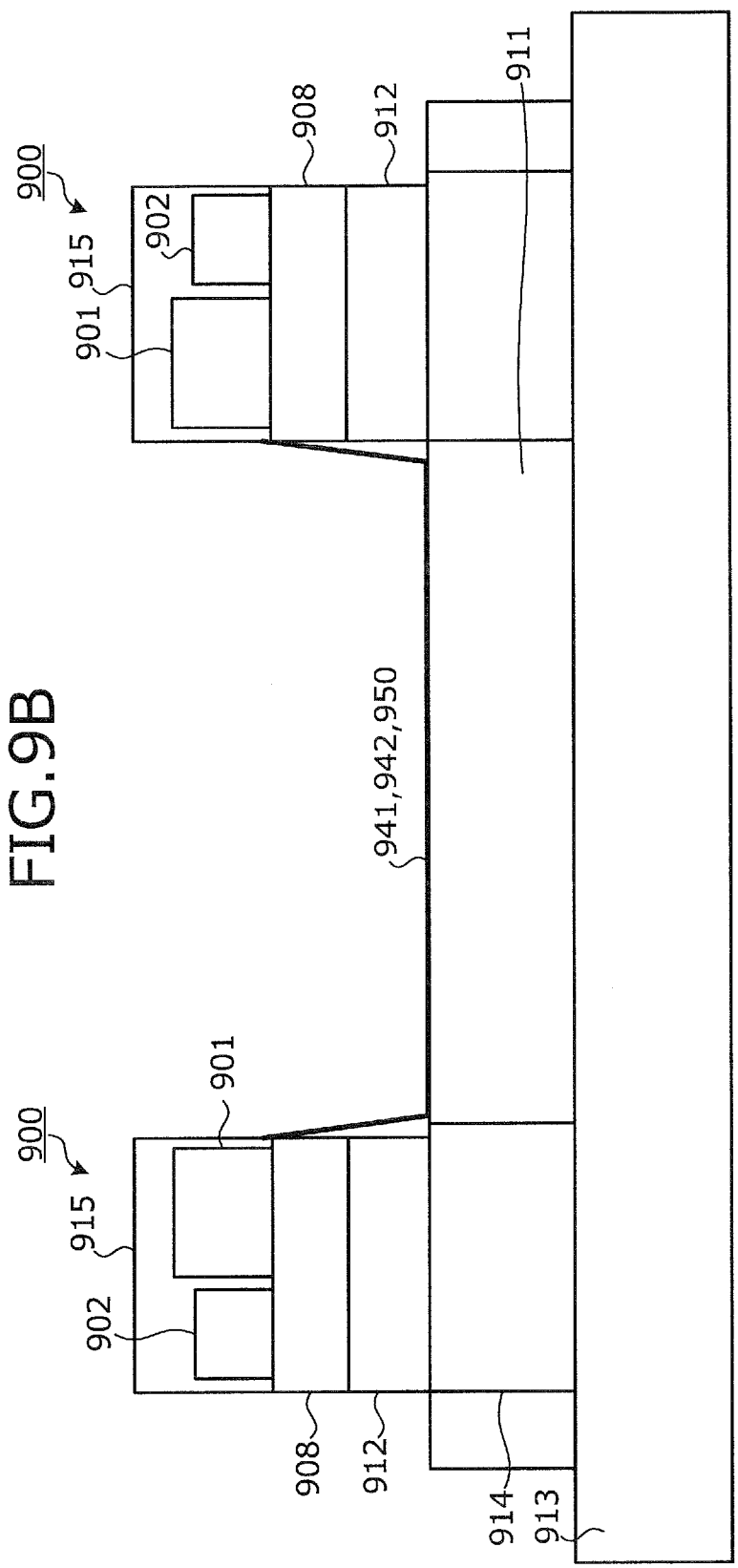

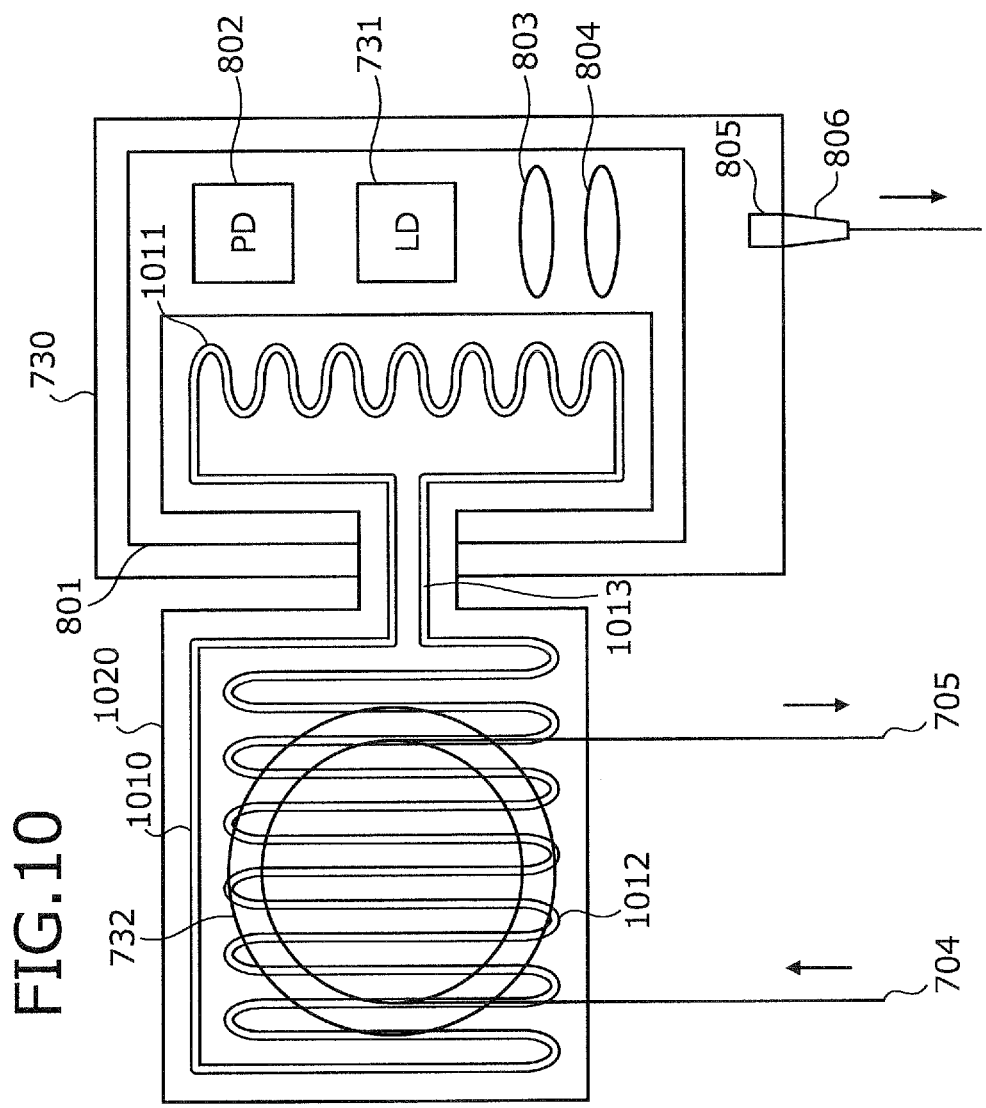

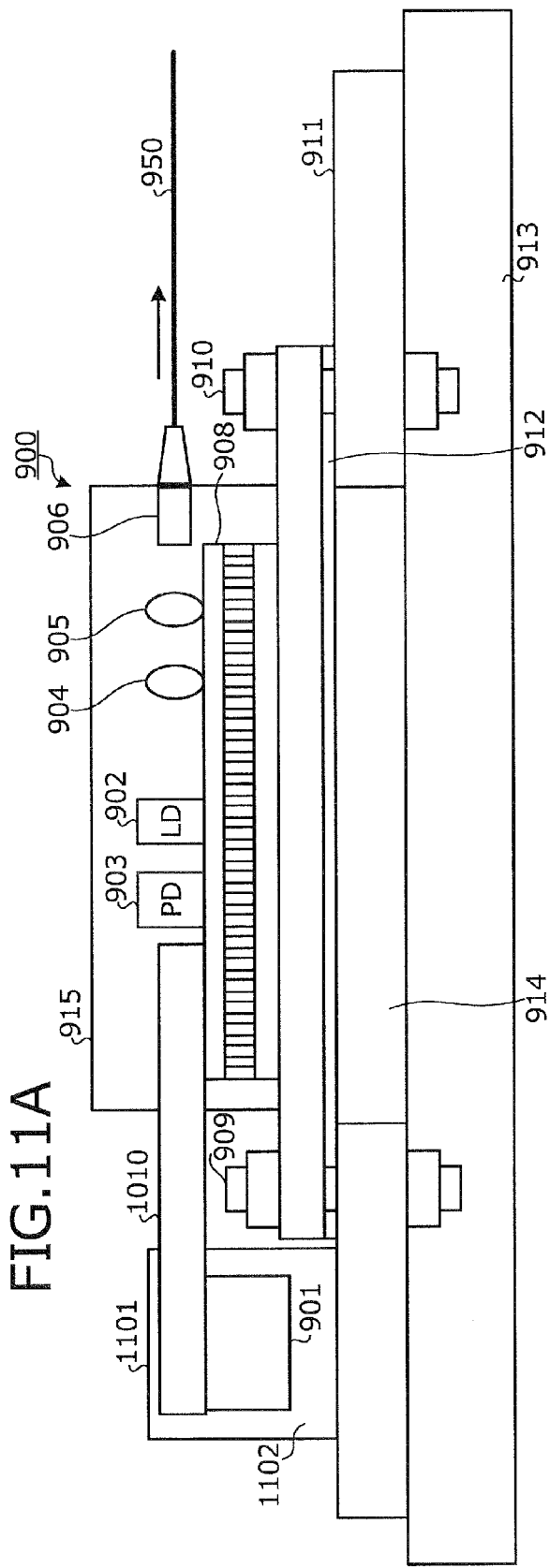

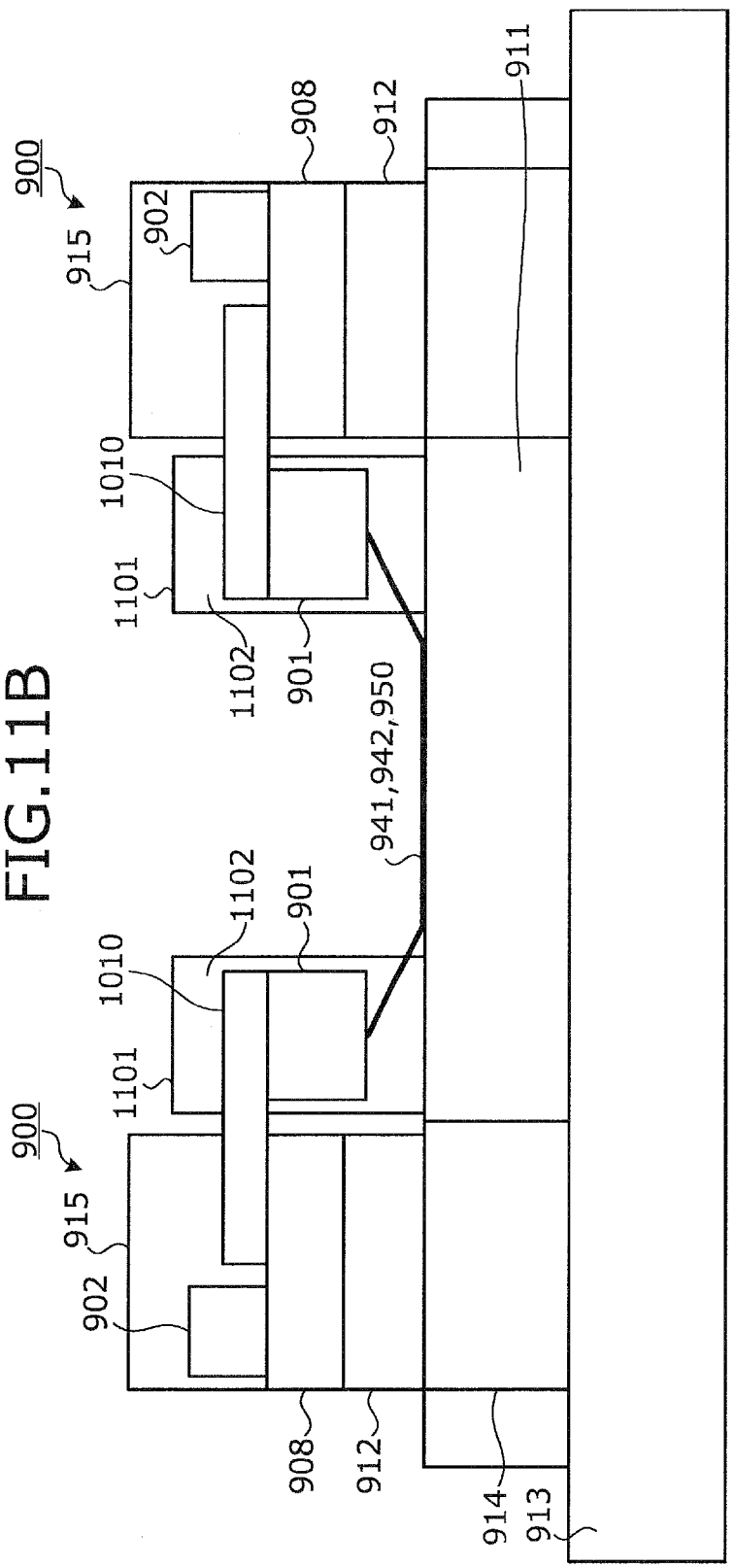

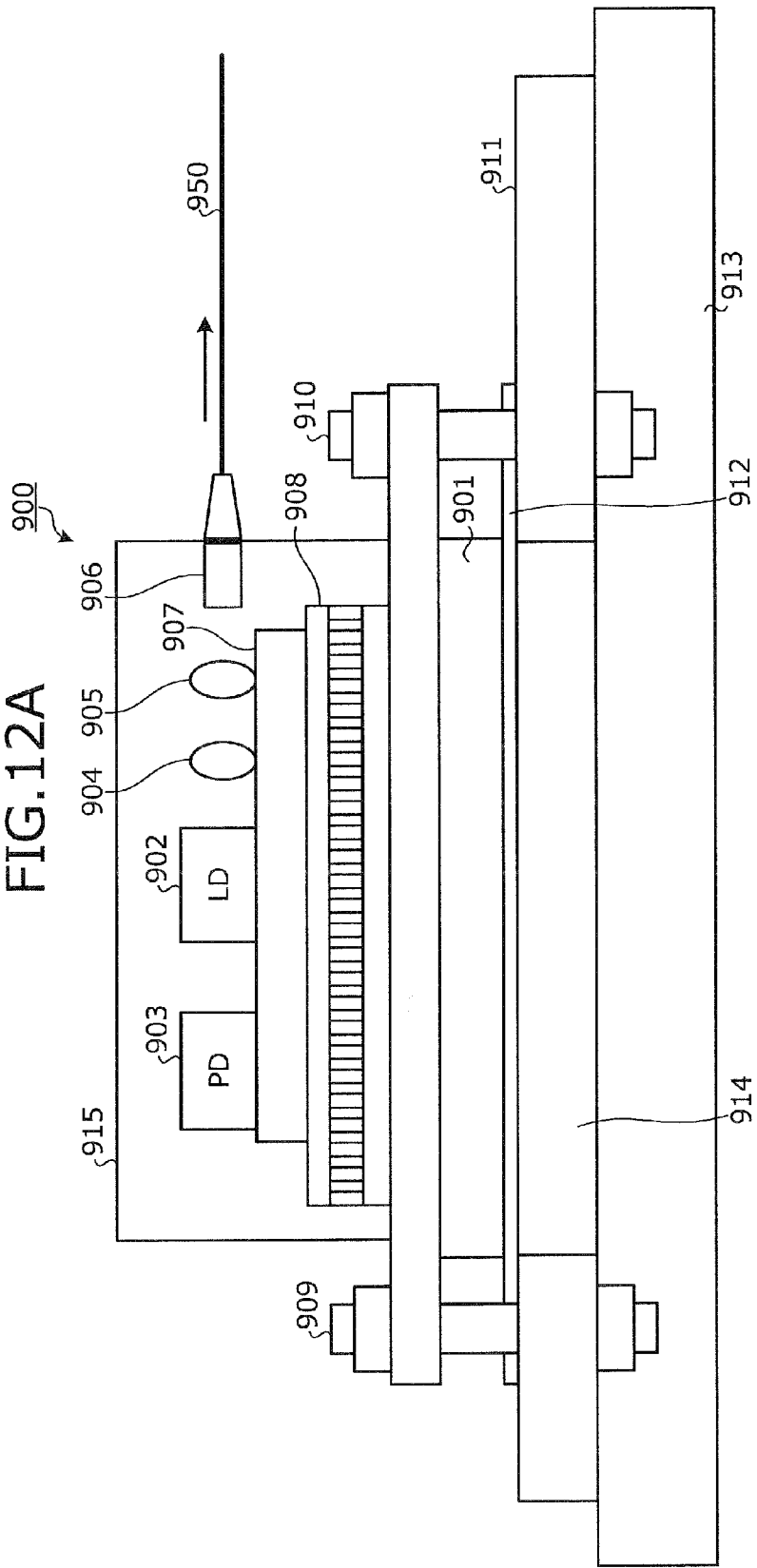

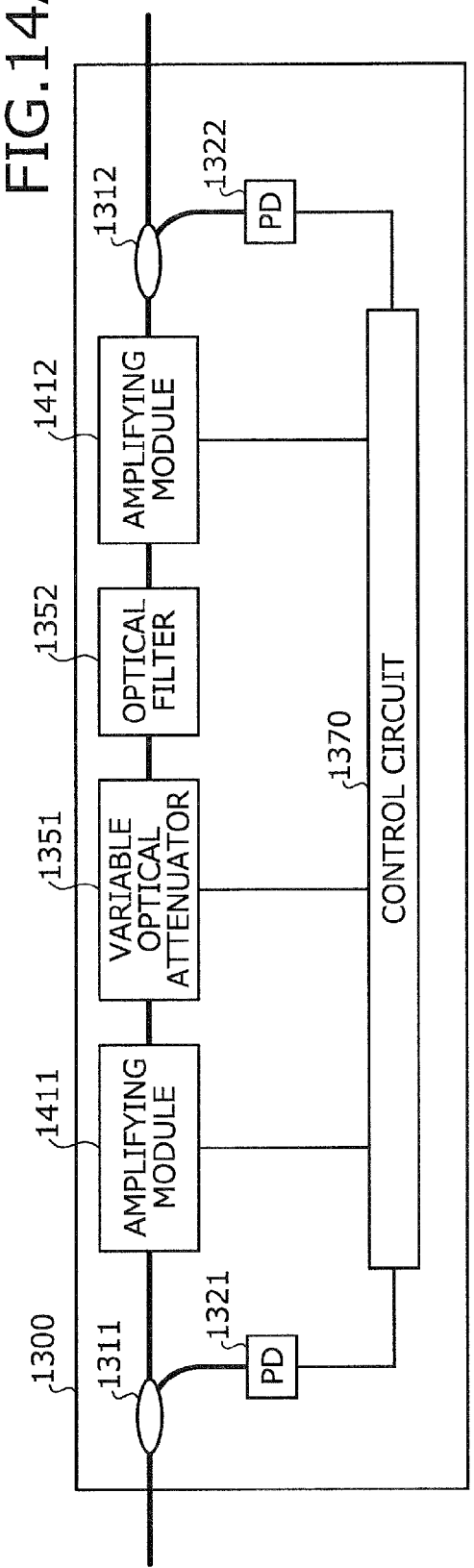

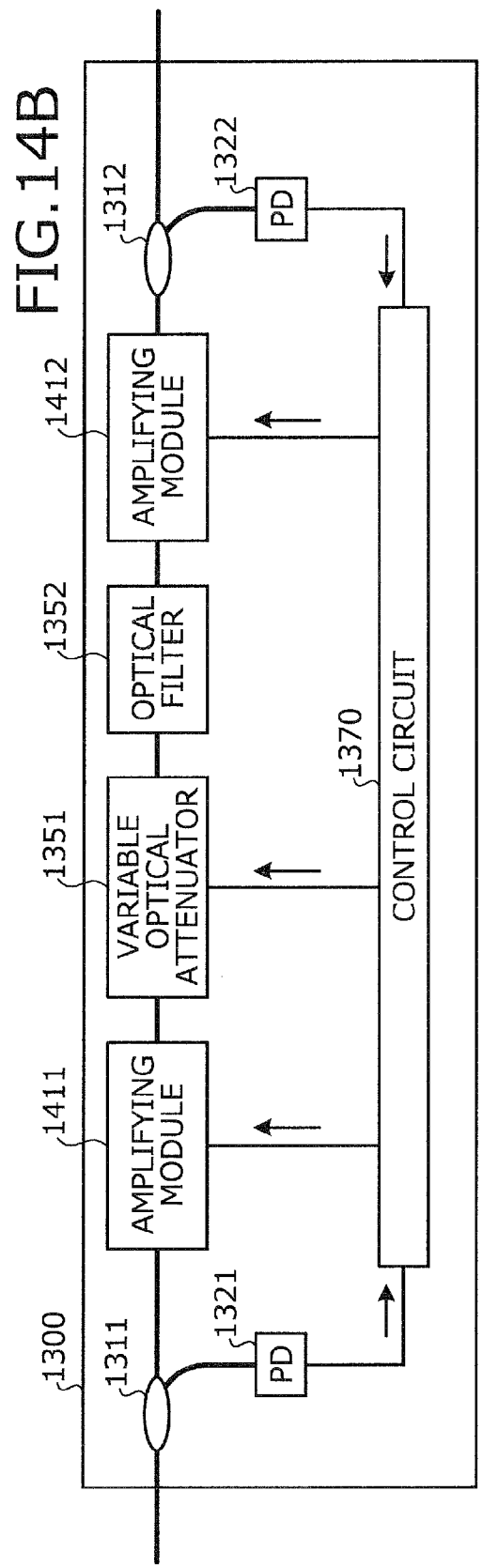

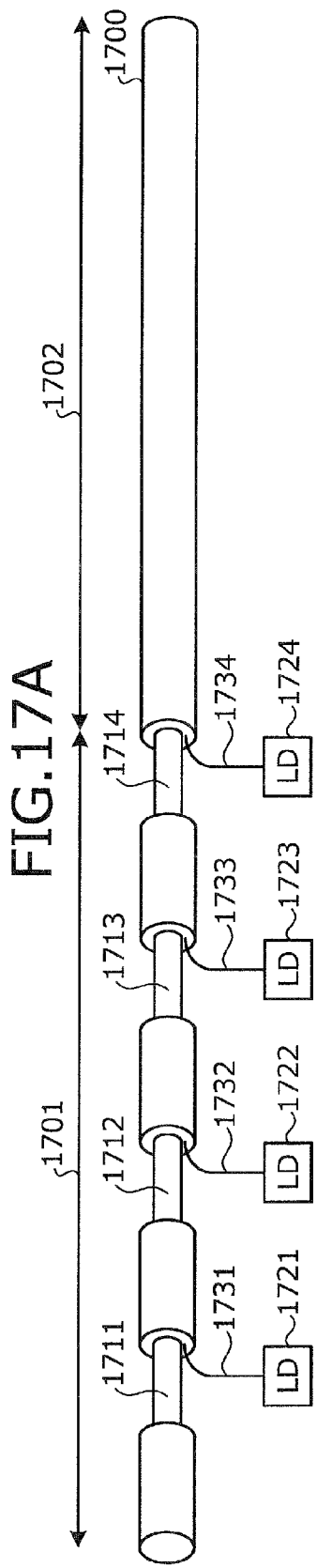

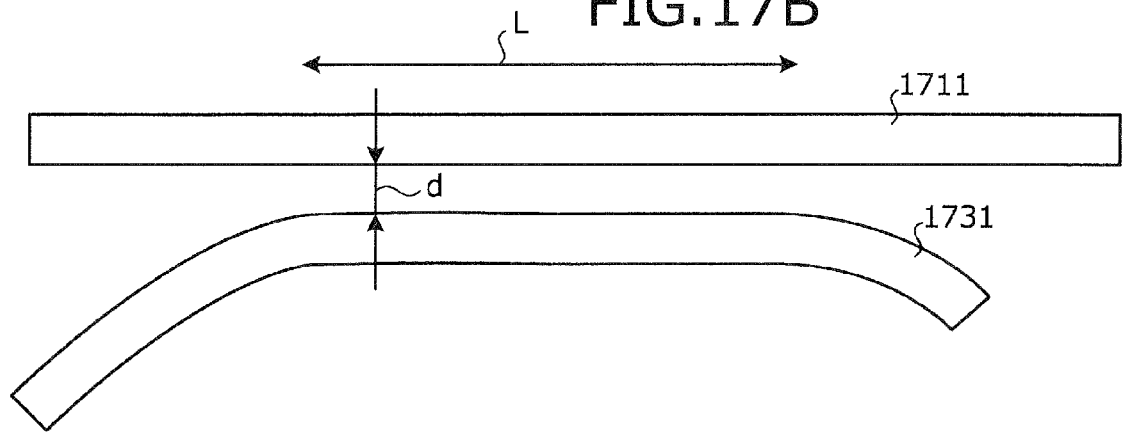
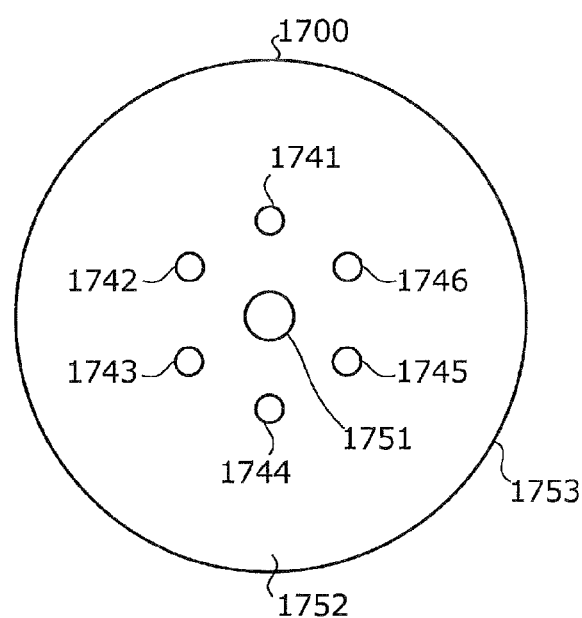

US 9,325,141 B2

AMPLIFYING APPARATUS AND AMPLIFYING MEDIUM

CROSS REFERENCE TO RELATED APPLICATIONS

This application is a continuation application of International Application PCT/JP2012/058026, filed on Mar. 27, 2012 and designating the U.S., the entire contents of which are incorporated herein by reference.

FIELD

The present embodiments relate to an amplifying apparatus and an amplifying medium that amplify light.

BACKGROUND

One conventional fiber-type amplifier, such as an erbium doped fiber amplifier (EDFA), uses an optical fiber doped with a rare earth element. To achieve favorable transmission properties, the gain wavelength property G ($\lambda$) of a fiber-type amplifier has to be flat to achieve favorable transmission properties.

The gain wavelength property G ($\lambda$) of an optical amplifying medium, such as an erbium doped fiber (EDF), varies according to the environmental temperature (for example, −15 [degrees C.] to +60 [degrees C.]) and may consequently drop. In contrast, a technique is known of adjusting the temperature of the optical amplifying medium using a temperature adjusting unit (see, e.g., Japanese Laid-Open Patent Publication No. H4-11794).

Nonetheless, according to the conventional technique, a problem arises in that the size of the apparatus is increased because a long optical fiber is used in the fiber-type amplifier.

SUMMARY

According to an aspect of an embodiment, an amplifying apparatus includes an optical fiber that includes a wound portion doped with a rare earth element and three-dimensionally wound, holes being formed in cladding of the optical fiber and surrounding a core of the optical fiber, the optical fiber transmitting signal light injected thereinto; a thermally conductive member in which the wound portion of the optical fiber embedded, the thermally conductive member having thermal conductivity; a light source that emits excitation light; an injecting unit that injects the excitation light emitted by the light source, into the optical fiber; and a temperature adjusting unit that includes a thermal coupling unit thermally connected to the light source and the thermally conductive member, the temperature adjusting unit adjusting a temperature of the thermal coupling unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2A is a diagram of a first modification example of the configuration of the amplifying medium;

FIG. 2B is a top view of the amplifying medium depicted in FIG. 2A;

FIG. 5 is a diagram of one example of relations between the normalization frequency and the normalization propagation constant;

FIG. 7B is a diagram of a modification example of the amplifying apparatus depicted in FIG. 7A;

FIG. 8B is a diagram of a modification example of the configuration of the LD module;

FIG. 9B is a diagram (Part II) of the first configuration example of the LD module to which the amplifying medium is applied;

FIG. 10 is a diagram of an example of a configuration having an amplifying member disposed outside the LD module;

FIG. 11A is a diagram (Part I) of a second configuration example of the LD module to which the amplifying medium is applied;

FIG. 11B is a diagram (Part II) of the second configuration example of the LD module applied to which the amplifying medium is applied;

FIG. 12A is a diagram (Part I) of a third configuration example of the LD module to which the amplifying medium is applied;

FIG. 14A is a diagram of a second example of the amplifying apparatus;

FIG. 14B is a diagram of an example of signal flow in the amplifying apparatus depicted in FIG. 14A;

FIG. 17A is a diagram of an example of an amplifier implemented by a holey fiber;

FIG. 17B is a diagram of an example of a fusion-spliced portion of the holey fiber depicted in FIG. 17A;

FIG. 17C is a cross-sectional diagram of the holey fiber depicted in FIG. 17A;

DESCRIPTION OF EMBODIMENTS

Embodiments of an amplifying apparatus and an amplifying medium will be described in detail with reference to the accompanying drawings.

Figure 1A:
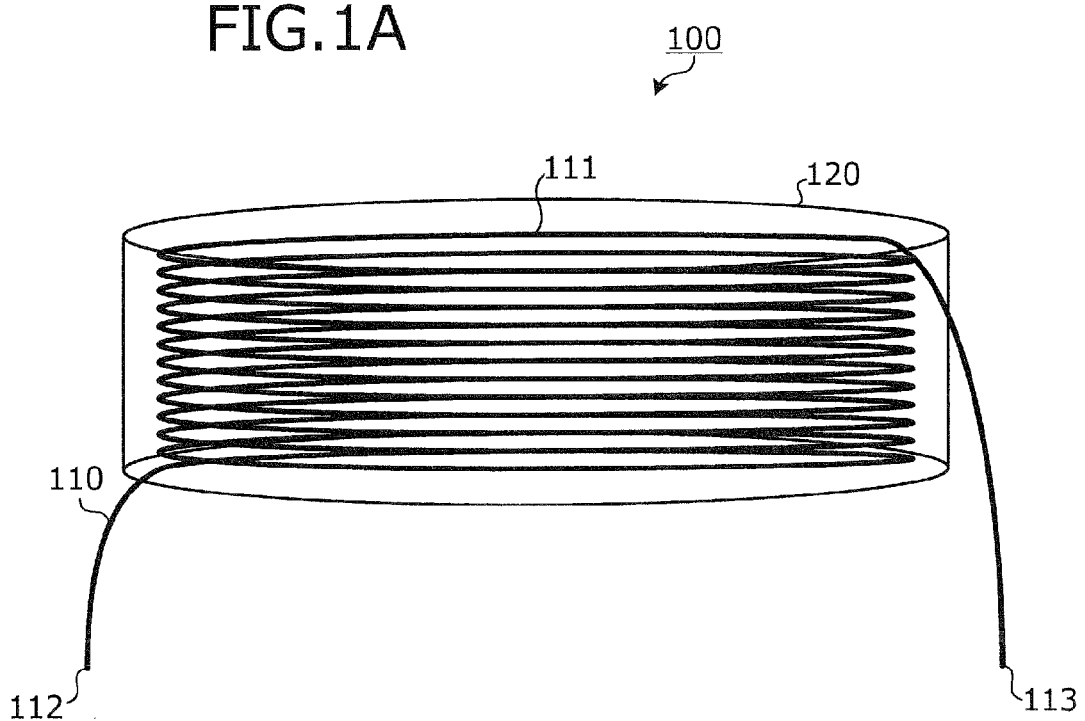
FIG. 1A is a diagram of an example of a configuration of an amplifying medium according to an embodiment.
Figure 1B:
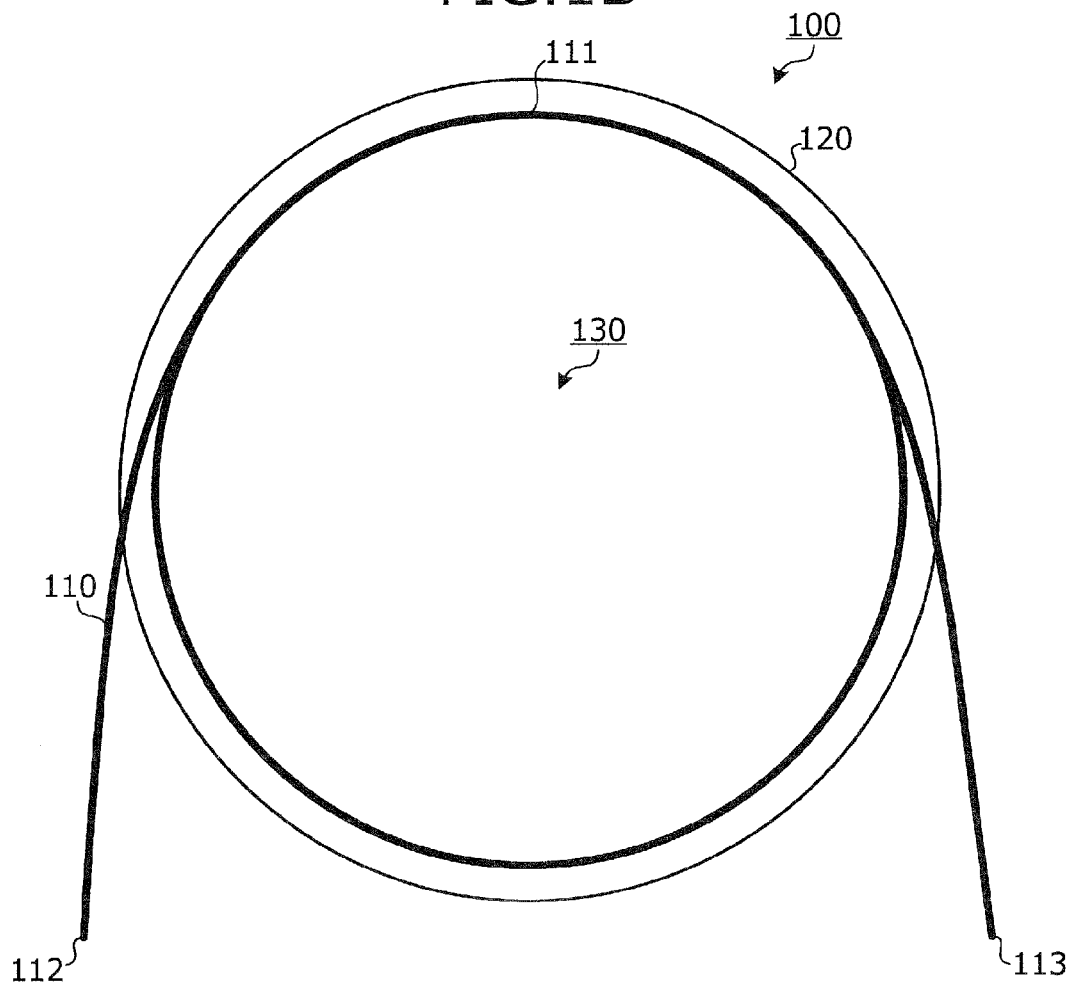
FIG. 1B is a top view of the amplifying medium depicted in FIG. 1A.

FIG. 1A is a diagram of an example of a configuration of the amplifying medium according to an embodiment. FIG. 1B is a top view of the amplifying medium depicted in FIG. 1A. As depicted in FIGS. 1A and 1B, the amplifying medium 100 according to the embodiment includes a holey fiber 110 and a resin member 120. The amplifying medium 100 is an amplifying medium that transmits signal light and excitation light therethrough and to thereby amplify the signal light.

The holey fiber 110 is an optical fiber in which plural holes parallel to the core are provided in the cladding. The core of the holey fiber 110 is doped (added) with a rare earth element such as erbium (Er ion). The holey fiber 110 includes a wound portion 111 that is wound three-dimensionally. In the example depicted in FIGS. 1A and 1B, the holey fiber 110 is wound in a spiral manner.

The wound portion 111 of the holey fiber 110 is embedded in the resin member 120. Ends 112 and 113 of the holey fiber 110 are guided out of the resin member 120. The resin member 120 is a thermally conductive member having thermal conductivity. The resin member 120 is, for example, made from a silicon resin. In the example depicted in FIGS. 1A and 1B, the resin member 120 is formed in a cylindrical shape. The resin member 120 made from the silicon resin, etc., has high thermal conductivity and therefore, the temperature of the resin member 120 is evenly maintained at a constant temperature by maintaining a portion of the resin member 120 (for example, one face thereof) to be a constant temperature (within a specific range).

The optical confinement property of the holey fiber 110 is strong and therefore, the bend radius of the wound portion 111 of the holey fiber 110 can be reduced (to, for example, 10 [mm] or less). Consequently, the area of the wound portion 111 can be reduced. On the other hand, when the bend radius of the wound portion 111 is reduced, the number of turns of the wound portion 111 is increased to secure the fiber length of the wound portion 111 and therefore, the height of the wound portion 111 is increased. For example, when the wound portion 111 of, for example, 5 [m] is wound with a bend radius of 10 [mm], the number of turns of the wound portion 111 is, for example, about 74.

Therefore, for example, when the resin member 120 is disposed on a top face of a thermo electric cooler (TEC) to adjust the temperature of the wound portion 111, portions of the wound portion 111 are present that are close to the TEC and away from the TEC.

In contrast, the wound portion 111 is embedded in the resin member 120 and therefore, the wound portion 111 can be evenly maintained at a constant temperature by adjusting the temperature of a portion of the resin member 120 to be constant by adjusting the temperature of a portion of the resin member 120. Thus, the temperature property of optical gain in the wound portion 111 of the holey fiber 110 can be suppressed and as a result, the optical transmission property can be improved.

In the example depicted in FIGS. 1A and 1B, the resin member 120 also occupies an internal space 130 of the wound portion 111 of the holey fiber 110 as depicted in FIG. 1B. Thereby, the temperature of the resin member 120 can be further stabilized and the temperature of the wound portion 111 embedded in the resin member 120 can be further stabilized. However, the resin member 120 can also be formed in a doughnut shape without filling the space 130 with the resin member 120, whereby the weight of the amplifying medium 100 can be reduced.

FIG. 2A is a diagram of a first modification example of the configuration of the amplifying medium. FIG. 2B is a top view of the amplifying medium depicted in FIG. 2A. In FIGS. 2A and 2B, components identical to the components depicted in FIGS. 1A and 1B are given the same reference numerals used in FIGS. 1A and 1B and will not again be described. As depicted in FIGS. 2A and 2B, the holey fiber 110 may include a wound portion 211 in the space 130 in addition to the wound portion 111. For example, light entering from the end 112, passes through the wound portion 111; enters the wound portion 211; passes through the wound portion 211; and is output from the end 113.

Thereby, the length of the amplifying portion of the holey fiber 110 can be further increased relative to the area of the amplifying medium 100. In FIGS. 2A and 2B, the wound portion 211 is formed such that the winding direction of the wound portion 211 and the winding direction of the wound portion 111 differ from each other by 90 [degrees]. Nonetheless, the shape of the wound portion 211 is not limited to the above and, for example, the wound portion 211 may be formed in a spiral manner having a bend radius smaller than that of the wound portion 111 and with the same winding direction as that of the wound portion 111.

The shape of the wound portion of the holey fiber 110 is not limited to those of the wound portions 111 depicted in FIG. 1A and the wound portions 111 and 211 depicted in FIG. 2A; and may take any one of various shapes. For example, the wound portion of the holey fiber 110 may have a shape acquired by stacking volute wound portions in plural tiers or a coiled-snake shape.

Figure 3:
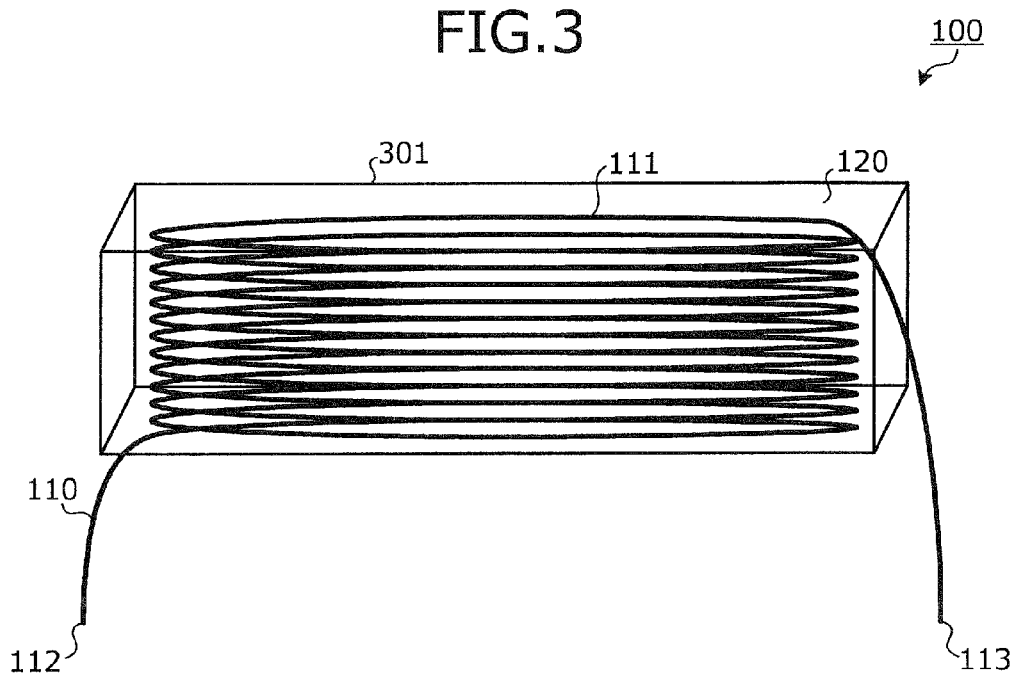
FIG. 3 is a diagram of a second modification example of the configuration of the amplifying medium.

FIG. 3 is a diagram of a second modification example of the configuration of the amplifying medium. In FIG. 3, components identical to the components depicted in FIGS. 1A and 1B are given the same reference numerals used in FIGS. 1A and 1B and will not again be described. As depicted in FIG. 3, the wound portion 111 of the holey fiber 110 and the resin member 120 may be sealed in a housing 301. In this case, for example, the resin member 120 is filled in the housing 301 accommodating the wound portion 111 and is solidified. Thereby, the shaping of the resin member 120 is facilitated. The housing 301 is disposed on the TEC by, for example, screws.

The housing 301 includes a thermal coupling unit that thermally couples the interior and the exterior of the housing 301. For example, the housing 301 is formed by a thermally conductive member such as, for example, an aluminum member. Thereby, the temperature of a portion of the housing 301 is set to be constant, whereby the temperature of the resin member 120 filled in the housing 301 can be set to be constant and consequently, the temperature of the wound portion 111 embedded in the resin member 120 can be set to be constant. Nonetheless, at least a portion of the housing 301 (for example, a face thereof) may be formed by the thermally conductive member. In this case, the temperature of the thermal coupling unit formed by the thermally conductive member of the housing 301 is set to be constant, whereby the temperature of the wound portion 111 can be set to be constant.

The configuration depicted in FIG. 3 may be adapted not to fill the housing 301 with the resin member 120. In this case, the wound portion 111 of the holey fiber 110 is sealed in the housing 301 and therefore, the temperature of the wound portion 111 can evenly be set to be constant by setting the temperature of the portion formed by the thermally conductive member of the housing 301 to be constant.

Figure 4A:
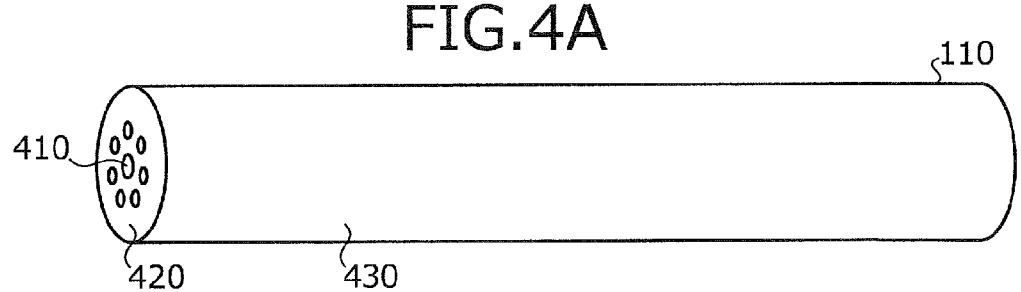
FIG. 4A is a diagram of an example of a holey fiber.
Figure 4B:
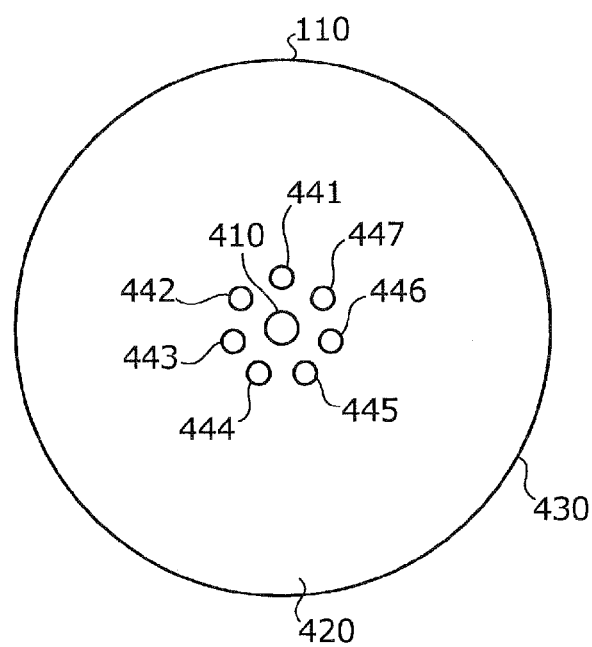
FIG. 4B is a cross-sectional diagram of the holey fiber depicted in FIG. 4A.

FIG. 4A is a diagram of an example of the holey fiber. FIG. 4B is a cross-sectional diagram of the holey fiber depicted in FIG. 4A. As depicted in FIGS. 4A and 4B, by employing, for example, a hole-assisted holey fiber as the holey fiber 110, a region surrounded by holes extending in the longitudinal direction of the holey fiber 110 has a high numerical aperture and therefore, the confinement of the excitation light and the signal light can be enhanced.

Thus, the overlap between the signal light and the excitation light can be increased, enabling the holey fiber 110 to be used as an optical fiber amplifier having high excitation efficiency. As depicted in FIGS. 4A and 4B, the holey fiber 110 includes a core 410, a cladding 420, and a covering portion 430.

The core 410 is a high refractive index portion whose reflective index is higher than that of the cladding 420. The core 410 is doped with erbium. For example, the core diameter (the diameter) of the core 410 may be set to be 6 [μm]. The core 410 is doped with, for example, erbium at 1,000 [ppm]. The core 410 may be added with germanium to increase its refractive index, or may be added with aluminum or phosphorus to acquire a broadband gain property.

The cladding 420 is a low refractive index portion whose reflective index is lower than that of the core 410. The cladding diameter (the diameter) of the cladding 420 may be set to be 125 [μm]. The cladding 420 has holes 441 to 447 disposed therein surrounding the core 410. Thus, in the cladding, the equivalent refractive index of the portion in which the holes 441 to 447 are disposed can be reduced, whereby the refractive difference between the cladding 420 and the core 410 becomes large and consequently, the light confinement property of the core 410 is enhanced. The hole diameter (the diameter) of each of the holes 441 to 447 may be set to be 6 to 8 [μm].

Thus, even when the bend radius of the holey fiber 110 is reduced to a radius within the range for the holey fiber 110 not to be broken, increases in insertion loss of the holey fiber 110 can be suppressed. For example, the bend radius of a conventional EDF is, for example, is 30 [mm] more. However, according to the holey fiber 110, the bend radius thereof can be set to be 5 [mm] or less.

Preferably, the distance between the core 410 and the holes 441 to 447 is reduced so that light travels in a single mode in the core 410. Alternatively, preferably, the number of the holes 441 to 447 is increased so that the light travels in a single mode in the core 410 (in the example depicted in FIGS. 4A to 4B, the number is seven). When the number of modes is increased, the excitation light passing through the holey fiber 110 spreads out of the doped region of erbium of the core 410 and the efficiency is degraded.

For example, when the amplifying medium 100 is applied to an EDFA that amplifies signal light of a C-Band (a 1,550-[nm] band), the length of the holey fiber 110 is set to be, for example, about 5 [m]. When the amplifying medium 100 is applied to an EDFA that amplifies signal light of an L-Band (a 1,580-[nm] band), the length of the holey fiber 110 is set to be, for example, about 20 [m].

The scheme of mode confinement of the holey fiber 110 is a refractive index confinement as that of the conventional EDF and therefore, as to the mode confinement, the performance is equivalent to that of the conventional EDF. The physical phenomenon of optical amplification by induced emission in the holey fiber 110 is same as that of the conventional EDF and therefore, properties such as the gain and noise can be set to achieve performance equivalent to conventional performance.

As to the polarization mode dispersion, the propagation constants of both polarization modes match one another only when the refraction index distribution is designed to form a point symmetry distribution and therefore, no polarization mode dependence is present. The polarization mode dependence can be suppressed by shaping the cross section of the holey fiber 110 to be close to a true circle.

Nonetheless, as described, a wavelength dispersion property not retained by the conventional EDF is generated depending on the design of the hole diameter and the pitch between the holes. This is because structural dispersion is significantly shifted into an abnormal dispersion region due to an effectively large relative refractive index difference generated between the core 410 and the cladding 420. Therefore, preferably, the holes 441 to 447 are not arranged into multiple rings but, as depicted in FIG. 4B, are arranged in one ring.

FIG. 5 is a diagram of one example of the relation between the normalization frequency and the normalization propagation constant. The reason behind reducing the diameter of the core 410 of the holey fiber 110 will be described with reference to FIG. 5. In FIG. 5, the horizontal axis represents the normalization frequency and the vertical axis represents the normalization propagation constant. Properties 501, 502, 503, . . . indicate the characteristics of the normalization propagation constants for the normalization frequencies in LP modes ($LP_{01}$, $LP_{11}$, $LP_{12}$, . . . ).

Light is propagated in the single mode by using the holey fiber 110 in a wavelength region that is greater than a cutoff wavelength λc. On the other hand, when light is input whose wavelength is less than the cutoff frequency λc, propagation is also enabled in a higher order mode and the transmission band is degraded due to differences in the propagation delay time between the modes (mode dispersion).

In the example depicted in FIG. 5, the frequency at which the propagation constant of $LP_{11}$ is zero is 2.405 (the property 502). Therefore, representing the propagation constant as "ν", the radius of the core 410 as "a", the refractive index of the core 410 as "$n_1$", the relative refractive index difference between the core 410 and the cladding 420 as "Δ", and the wavelength of the light as "λ", the condition for the single mode propagation is "$\nu = 2\pi a n_1 \sqrt{2\Delta}/\lambda < 2.405 \approx 2.4$. Therefore, for example, the frequency at which ν is ν=2.4 is defined as the cutoff wavelength λc.

When 2a, Δ, and $n_1$ are 2a=10 [μm], Δ=0.3%, and $n_1$=1.45, the cutoff wavelength λc of the single mode fiber is 1.45 [μm]. In this case, multi-mode propagation is established when light having a wavelength less than the cutoff wavelength λc is input into the holey fiber 110.

When the amplifying medium 100 is used in an EDFA, this case differs from the common holey fiber in that not only the signal light but also the excitation light are stably guided. The wavelength of the excitation light is less than that of the signal light and therefore, the single mode is realized by applying the holey fiber 110, whose core diameter (≈MFD) is small compared to that of the common holey fiber.

Figure 6:
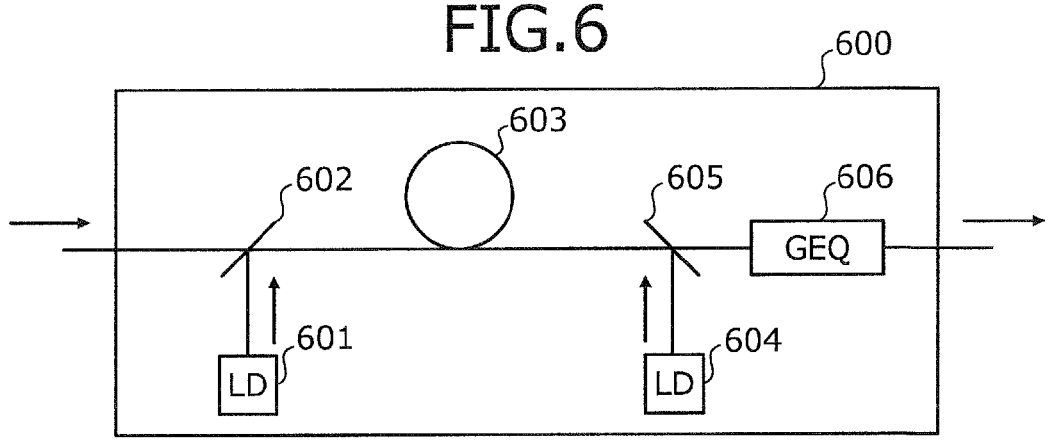
FIG. 6 is a diagram of an example of a configuration of an amplifying apparatus to which the amplifying medium is applied.

FIG. 6 is a diagram of an example of the configuration of the amplifying apparatus to which the amplifying medium is applied. An amplifying medium 600 depicted in FIG. 6 is an EDFA that includes LDs 601 and 604, couplers 602 and 605, an amplifying medium 603, and a gain equalizer (GEQ) 606.

An isolator is generally included in the main signal system to cause the signal light to travel in one direction. However, in FIG. 6, the isolator is unrelated to the description of the subject matter of the embodiments and will not be described.

The LD 601 generates excitation light and outputs the excitation light to the coupler 602. The coupler 602 is an injecting unit that wave-couples the excitation light from the LD 601 and signal light injected thereinto, and injects the wave-coupled light into the amplifying medium 603. For example, the coupler 602 wave-couples the signal light injected into the amplifying apparatus 600 and the excitation light from the LD 601 with each other, and injects the signal light wave-coupled with the excitation light into the amplifying medium 603.

The amplifying medium 603 transmits the signal light and the excitation light from the coupler 602, and in a direction opposite to the direction of the signal light and the excitation light from the coupler 602, transmits the excitation light from the coupler 605. Thus, the signal light output from the coupler 602 and transmitted through the amplifying medium 603 is amplified by induced emission. The signal light transmitted through the amplifying medium 603 is output to the coupler 605. The amplifying medium 100 is applicable to the amplifying medium 603.

The coupler 605 is an injecting unit that injects the excitation light from the LD 604 into the amplifying medium 603 in a direction opposite to the direction of the signal light. For example, the coupler 605 outputs the excitation light from the LD 604 to the amplifying medium 603. The coupler 605 outputs the signal light from the amplifying medium 603 to the GEQ 606. The GEQ 606 executes a gain equalization process for the signal light from the coupler 605. The GEQ 606 outputs the signal light for which the gain equalization process is executed thereby, to a destination downstream from the amplifying apparatus 600.

In FIG. 6, the configuration is adapted to execute both forward pumping and backward pumping by disposing the LDs 601 and 604, and the couplers 602 and 605. However, the configuration may be adapted to execute either the forward pumping or the backward pumping. For example, the configuration may be adapted to exclude the LD 601 and the coupler 602 from the amplifying apparatus 600, or may be adapted to exclude the LD 604 and the coupler 605 from the amplifying apparatus 600. The couplers 602 and 605 may each be implemented by, for example, a WDM coupler, a dielectric multi-layer film optical filter, an etalon optical filter, or a circulator.

Figure 7A:
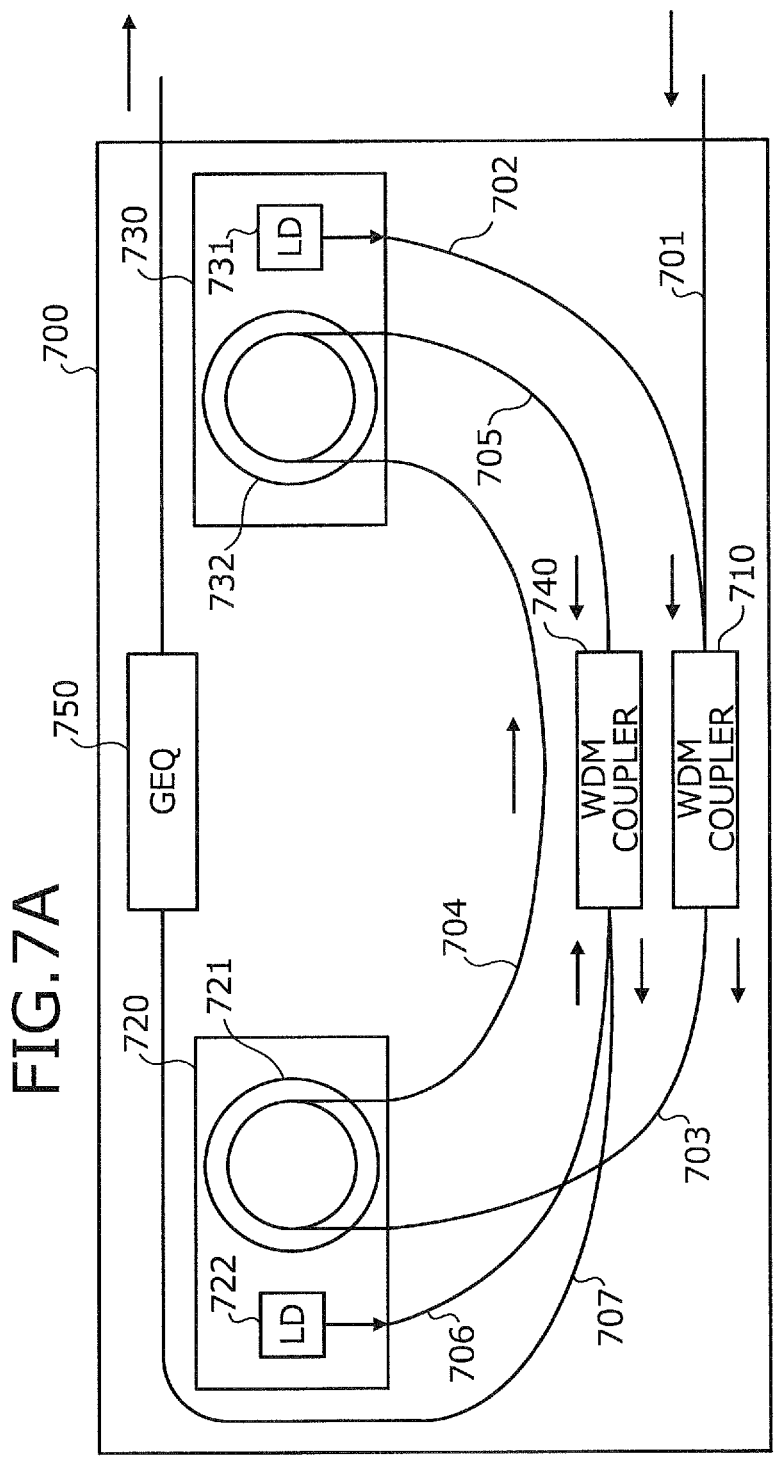
FIG. 7A is a diagram of a specific example of the configuration of the amplifying apparatus to which the amplifying medium is applied.

FIG. 7A is a diagram of a specific example of the configuration of the amplifying apparatus to which the amplifying medium is applied. The amplifying apparatus 700 depicted in FIG. 7A includes fibers 701 to 707, WDM couplers 710 and 740, LD modules 720 and 730, and a GEQ 750.

Signal light injected into the amplifying apparatus 700 passes through the fiber 701 and is injected into the WDM coupler 710. The WDM coupler 710 has a configuration corresponding to that of the coupler 602 depicted in FIG. 6. The WDM coupler 710 wave-couples the light from the fiber 701 and the excitation light emitted from the LD module 730 and injected thereinto from the fiber 702, and outputs the wave-coupled light. The light output from the WDM coupler 710 passes through the fiber 703 and is injected into the LD module 720.

The LD module 720 includes an amplifying medium 721 and the LD 722. The amplifying medium 721 has a configuration corresponding to a portion of the amplifying medium 603 depicted in FIG. 6. The amplifying medium 100 is applicable to the amplifying medium 721. The amplifying medium 721 transmits the light from the fiber 703 and outputs the light. The light emitted from the amplifying medium 721 passes through the fiber 704 and is injected into the LD module 730. The amplifying medium 721 transmits the excitation light from the fiber 704 and injects the excitation light into the fiber 703. The LD 722 has a configuration corresponding to the LD 604 depicted in FIG. 6. The LD 722 generates and outputs excitation light. The excitation light emitted from the LD 722 passes through the fiber 706 and is injected into the WDM coupler 740.

The LD module 730 includes an LD 731 and an amplifying medium 732. The LD 731 has a configuration corresponding to that of the LD 601 depicted in FIG. 6. The LD 731 generates and outputs excitation light. The excitation light emitted from the LD 731 passes through the fiber 702 and is injected into the WDM coupler 710.

The amplifying medium 732 has a configuration corresponding to a portion of the amplifying medium 603 depicted in FIG. 6. The amplifying medium 100 is applicable to the amplifying medium 732. The amplifying medium 732 transmits the light from the fiber 704 and injects the light into the fiber 705. The light injected from the amplifying medium 732 into the fiber 705 is injected into the WDM coupler 740. The amplifying medium 732 transmits the excitation light from the fiber 705 and injects the excitation light into the fiber 704. The excitation light injected from the amplifying medium 732 into the fiber 704 is injected into the amplifying medium 721.

The WDM coupler 740 has a configuration corresponding to that of the coupler 605 depicted in FIG. 6. The WDM coupler 740 injects the excitation light from the fiber 706, into the fiber 705. The excitation light injected from the WDM coupler 740 into the fiber 705 is injected into the amplifying medium 732. The WDM coupler 740 injects the light from the fiber 705, into the fiber 707. The light injected from the WDM coupler 740 into the fiber 707 is injected into the GEQ 750 as signal light obtained by amplifying the signal light injected into the amplifying apparatus 700.

The GEQ 750 has a configuration corresponding to that of the GEQ 606 depicted in FIG. 6. The GEQ 750 executes the gain equalization process for the signal light from the fiber 707. The GEQ 750 outputs to a destination downstream from the amplifying apparatus 700, the signal light subject to the gain equalization process thereby. The configuration of each of the LD modules 720 and 730 will be described.

The holey fiber 110 of the amplifying medium 732 is a first optical fiber. The resin member 120 of the amplifying medium 732 is a first thermally conductive member. The LD 731 is a first light source. The WDM coupler 710 is a first injecting unit. The TEC of the LD module 730 (see, e.g., FIGS. 8A and 8B) is a first temperature adjusting unit.

The holey fiber 110 of the amplifying medium 721 is a second optical fiber. The resin member 120 of the amplifying medium 721 is a second thermally conductive member. The LD 722 is a second light source. The TEC of the LD module 720 (see, e.g., FIGS. 8A and 8B) is a second temperature adjusting unit. The WDM coupler 740 is a second injecting unit.

An output end of the holey fiber 110 of the amplifying medium 721 (the second optical fiber) is connected to an input end of the holey fiber 110 of the amplifying medium 732 (the first optical fiber) through the fiber 704. The WDM coupler 710 (the first injecting unit) wave-couples the excitation light injected thereinto by the LD 731 (the first light source) and the signal light from the fiber 701, and injects the wave-coupled light into the input end of the holey fiber 110 of the amplifying medium 732 (the first optical fiber). The WDM coupler 740

(the second injecting unit) injects the excitation light emitted by the LD 722 (the second light source) into the output end of the holey fiber 110 (the first optical fiber) of the amplifying medium 732 in a direction opposite to that of the signal light. The WDM coupler 740 injects into the GEQ 750, the signal light from the output end of the holey fiber 110 of the amplifying medium 732 (the first optical fiber).

FIG. 7B is a diagram of a modification example of the amplifying apparatus depicted in FIG. 7A. In FIG. 7B, components identical to the components depicted in FIG. 7A are given the same reference numerals used in FIG. 7A and will not again be described. As depicted in FIG. 7B, the amplifying apparatus 700 depicted in FIG. 7A may be adapted to have the fiber 703 guided from the WDM coupler 710, connected to the amplifying medium 732 of the LD module 730. In this case, the amplifying apparatus 700 is configured to guide the fiber 705 connected to the WDM coupler 740 from the amplifying medium 721 of the LD module 720. As described, the optical path in the amplifying apparatus 700 can be modified in various ways.

Figure 8A:
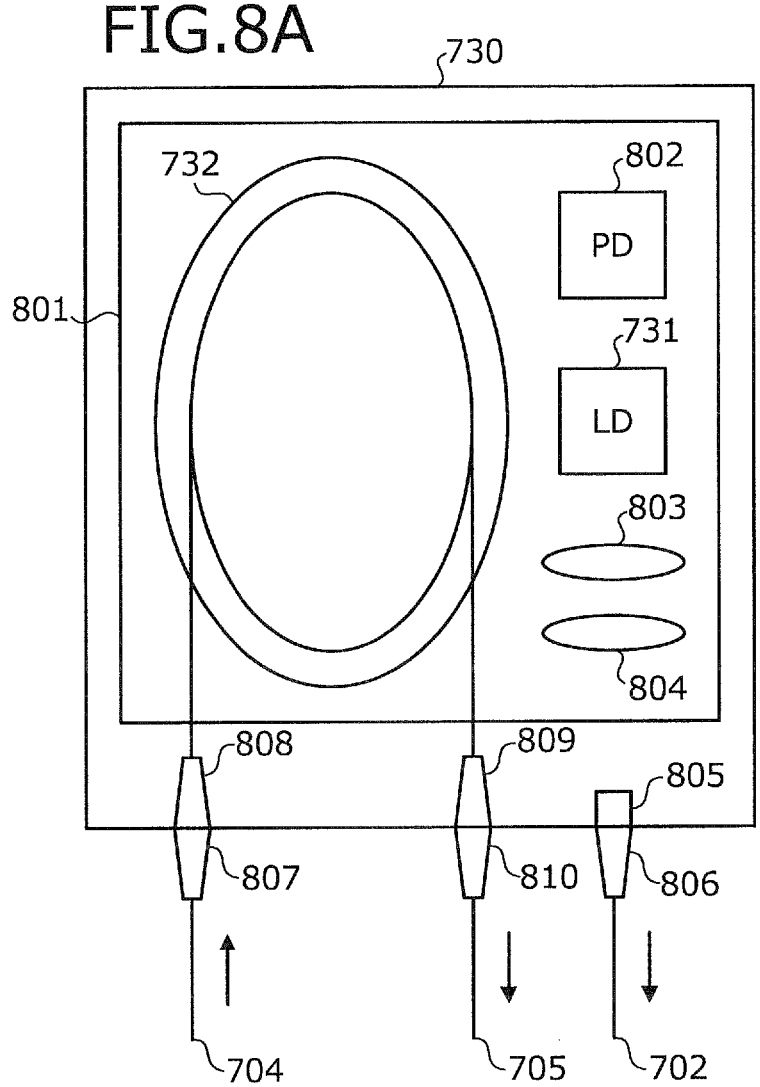
FIG. 8A is a diagram of an example of a configuration of an LD module.

FIG. 8A is a diagram of an example of the configuration of the LD module. In FIG. 8A, components identical to the components depicted in FIG. 7A are given the same reference numerals used in FIG. 7A and will not again be described. Although the configuration of the LD module 730 will be described with reference to FIG. 8A, the configuration of the LD module 720 is same as that of the LD module 730. As depicted in FIG. 8A, the LD module 730 includes a TEC 801, the LD 731, a photo diode (PD) 802, lenses 803 and 804, a ferrule 805, connectors 808 and 809, and the amplifying medium 732.

The LD 731, the PD 802, the lenses 803 and 804, and the amplifying medium 732 are disposed attached on the TEC 801. The TEC 801 controls the temperature to be constant for the LD 731, the PD 802, the lenses 803 and 804, and the amplifying medium 732. The TEC 801 is, for example, a Peltier device. The TEC 801 includes a thermal coupling unit that is thermally connected to the LD 731, and the resin member 120 of the amplifying medium 732, and is a temperature adjusting unit that adjusts the temperature of the thermal coupling unit. The thermal coupling unit of the TEC 801 is, for example, a top face of the TEC 801.

The LD 731 generates excitation light and outputs the excitation light to the lens 803. The PD 802 receives the backward light of the LD 731. The lenses 803 and 804 transmit the excitation light emitted from the LD 731 and output the excitation light to the ferrule 805. The ferrule 805 is connected to the fiber 702 through the connector 806. Thus, the excitation light emitted from the LD 731 is injected into the fiber 705.

The connector 808 is connected to the fiber 704 through the connector 807. Thus, the light from the fiber 704 is injected into the connector 808. The connector 808 outputs the light to the amplifying medium 732. The amplifying medium 732 transmits the light from the connector 808 and outputs the light to the connector 809.

The connector 809 is connected to the fiber 705 through the connector 810. Thus, the light injected thereinto from the amplifying medium 732 is injected into the fiber 705. The excitation light injected from the fiber 705 passes through the amplifying medium 732 and is injected into the fiber 704.

As described, the application of the amplifying medium 100 to the amplifying medium 732 enables reduction of the area of the amplifying medium 732 and therefore, the LD 731 and the amplifying medium 732 can be disposed on the same TEC 801 and the temperature thereof can be controlled. The application of the amplifying medium 100 to the amplifying medium 732 enables the TEC 801 to control the temperature of the one face of the amplifying medium 732, whereby the temperature of the wound portion 111 of the holey fiber 110 in the amplifying medium 732 can be set to be evenly constant and the amplification property can be improved. The area of the amplifying medium 732 (the amplifying medium 100) can be reduced and therefore, reduction of the area of the TEC 801 is also enabled. Therefore, reductions in power consumption can be facilitated.

The LD module 730 depicted in FIG. 8A can realize a module that integrates therein the LD 731 and the amplifying medium 732. In this case, the housing of the LD module 730 is connected to the three fibers 702, 704, and 705.

FIG. 8B is a diagram of a modification example of the configuration of the LD module. In FIG. 8B, components identical to the components depicted in FIG. 8A are given the same reference numerals used in FIG. 8A and will not again be described. As depicted in FIG. 8B, the LD 731 and the PD 802 may be disposed in the interior (the space 130 depicted in FIG. 1B) of the holey fiber of the amplifying medium 732. Thus, the area of the LD module 730 can be further reduced.

In the example depicted in FIG. 8B, the LD module 730 includes a lensed fiber 821 instead of the lenses 803 and 804 depicted in FIG. 8A. The excitation light emitted from the LD 731 is injected into the lensed fiber 821. The lensed fiber 821 outputs the excitation light injected thereinto, to the ferrule 805.

Figure 9A:
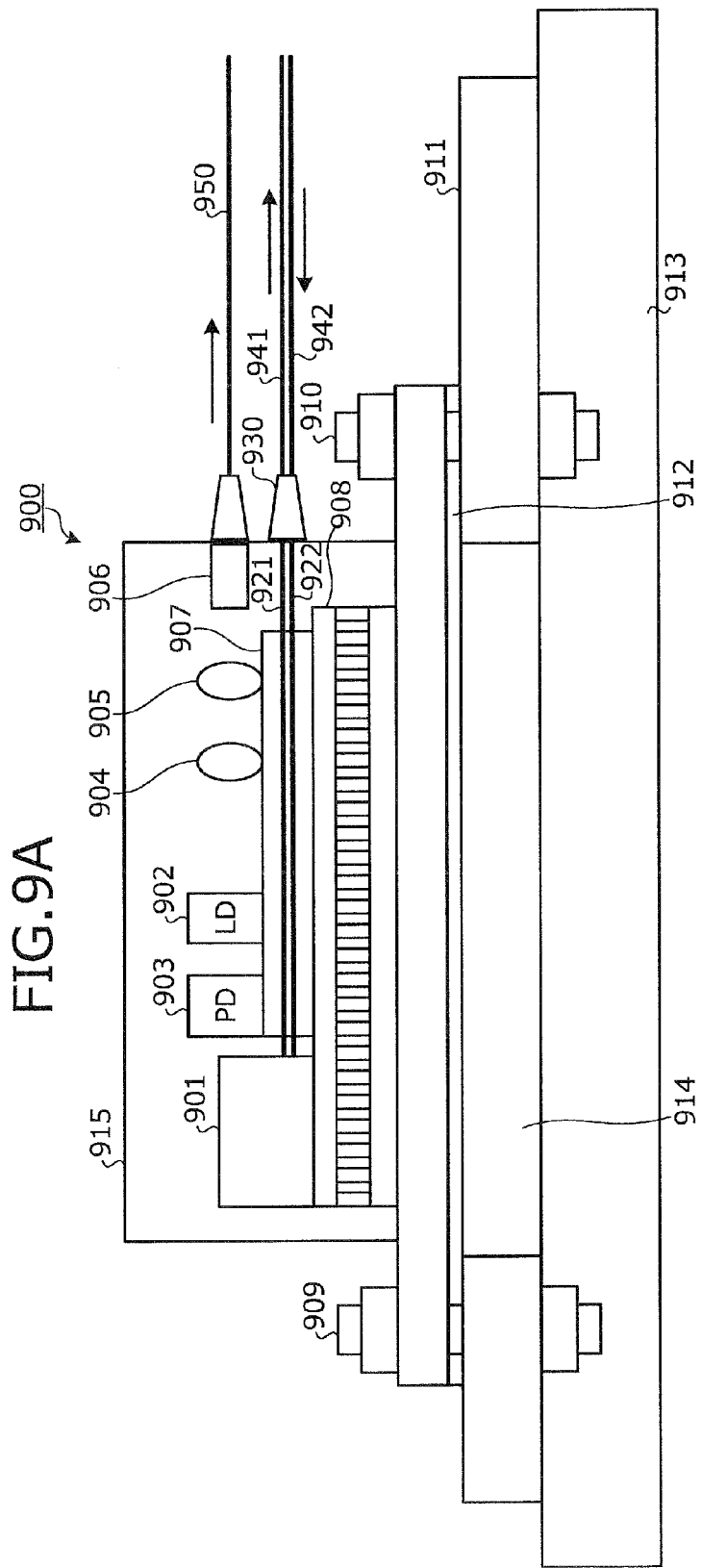
FIG. 9A is a diagram (Part I) of a first configuration example of an LD module to which the amplifying medium is applied.

FIG. 9A is a diagram (Part I) of a first configuration example of an LD module to which the amplifying medium is applied. The LD module 900 depicted in FIG. 9A includes, in a housing 915, an amplifying medium 901, an LD 902, a PD 903, lenses 904 and 905, a ferrule 906, a fixed bed 907, and a TEC 908.

The amplifying medium 901 has a configuration corresponding to that of the LD 731 depicted in FIGS. 8A and 8B. The amplifying medium 100 is applicable to the amplifying medium 901. The amplifying medium 901 is connected to fibers 921 and 922. The fibers 921 and 922 are connected to fibers 941 and 942 through a connector 930.

The fibers 941 and 942 have configurations respectively corresponding to those of the fibers 702 and 704 depicted in FIGS. 8A and 8B. The light injected into the fiber 942 is injected into the amplifying medium 901 through the connector 930 and the fiber 922, and passes through the amplifying medium 901. The light passing through the amplifying medium 901 is output from the fiber 941 via the fiber 921 and the connector 930.

The fixed bed 907 is formed by the thermally conductive member, and has the LD 902, the PD 903, and the lenses 904 and 905 mounted thereon. The LD 902, the PD 903, and the lenses 904 and 905 have configurations respectively corresponding to those of the LD 731, the PD 802, and the lenses 803 and 804 (the lensed fiber 821) depicted in FIGS. 8A and 8B. The LD 902 emits excitation light to the lens 905, and emits the backward light to the PD 903. The PD 903 receives the backward light emitted from the LD 902.

The lenses 904 and 905 transmit the excitation light emitted from the LD 902, to the ferrule 906. The ferrule 906 injects the excitation light from the lens 905, into the fiber 950 that is connected to the housing 915. The fiber 950 has a configuration corresponding to that of the fiber 702 depicted in FIGS. 8A and 8B, and outputs the excitation light from the ferrule 906, to a destination outside the housing 915.

The fixed bed 907 is fixed to the housing 915 through the TEC 908. The amplifying medium 901 is fixed onto the TEC 908 by screws, etc. The TEC 908 has a configuration corresponding to that of the TEC 801 depicted in FIGS. 8A and 8B.

The TEC 908 originally is a component to control the temperature of the LD 902 to be constant. The fixed bed 907 is used whose area is formed to be somewhat larger, or whose area is somewhat increased and that is formed by a material having high thermal conductivity, and the amplifying medium 901 is mounted on the fixed bed 907. The TEC 908 controls the temperature of the fixed bed 907 to be constant. Thereby, the temperature of the LD 902 and that of the PD 903 together with that of the amplifying medium 901 can be maintained to be constant.

A case 913 is, for example, a case for the optical amplifier and is formed by, for example, aluminum. The housing 915 is fixed to the case 913 by screws 909 and 910. A heat dissipating sheet 912 and a printed circuit board 911 are disposed between the housing 915 and the case 913. A heat sink 914 of aluminum, etc. is disposed on the printed circuit board 911. Thereby, the heat of the housing 915 is dissipated into the exterior through the heat dissipating sheet 912, the heat sink, and the case 913.

As depicted in FIG. 9A, the amplifying medium 901 is disposed at a position at which the amplifying medium 901 does not obstruct the excitation light emitted by the LD 902. However, the position and a method to dispose the amplifying medium 901 are not limited to those depicted in FIG. 9A and various positions and various methods can be employed.

FIG. 9B is a diagram (Part II) of the first configuration example of the LD module to which the amplifying medium is applied. In FIG. 9B, components identical to the components depicted in FIG. 9A are given the same reference numerals used in FIG. 9A and will not again be described. In FIG. 9B, a configuration will be described having two LD modules 900 depicted in FIG. 9A disposed on one printed circuit board (the printed circuit board 911).

When two LD modules are disposed in one amplifying apparatus, as depicted in FIG. 9B, the fibers 941, 942, and 950 connected to the LD module 900 are disposed on the printed circuit board 911 between the two LD modules 900.

Each of the TEC 908 of the two LD modules 900 controls the temperature of the amplifying medium 901 and that of the LD 902 collectively. The two amplifying media 901 to be an amplifying unit are each disposed isolated from each other on the TEC of each of the two LD modules and therefore, the temperature of each of the amplifying media 901 can efficiently be controlled.

The fibers 941, 942, and 950 disposed on the printed circuit board 911 between the two LD modules 900 are away from the TEC 908. However, the fibers 941, 942, and 950 are short fibers compared to the amplifying medium 901 and therefore, the influence thereof on the gain property is insignificant.

FIG. 10 is a diagram of an example of the configuration having an amplifying member disposed outside the LD module. In FIG. 10, components identical to the components depicted in FIG. 8A are given the same reference numerals used in FIG. 8A and will not again be described. As depicted in FIG. 10, the amplifying medium 732 may be disposed outside the LD module 730. In this case, for example, the amplifying medium 732 is connected to the TEC 801 through a heat pipe 1010.

The heat pipe 1010 includes a portion 1011 in contact with the TEC 801, a portion 1012 in contact with the amplifying medium 732, and a connecting portion 1013 connecting the portions 1011 and 1012. Thus, the amplifying medium 732 and the TEC 801 are in a heat equilibrium state. The heat pipe 1010 is, for example, a micro heat pipe.

As described, configuration may be such that the amplifying medium 732 and the TEC 801 are not in contact with each other, and only have to be thermally connected to each other through the thermally conductive member such as, for example, the heat pipe 1010. The temperature variation of the amplifying medium 732 is gradual and therefore, the temperature of the amplifying medium 732 can be stabilized even when the amplifying medium 732 and the TEC 801 are connected through the heat pipe 1010.

The portion of the heat pipe 1010 not in contact with the TEC 801 or the amplifying medium 732 is covered with a thermally insulating member 1020. Thereby, the temperature of the heat pipe 1010 can be further stabilized and the temperature of the amplifying medium 732 can be stabilized.

FIG. 11A is a diagram (Part I) of a second configuration example of the LD module to which the amplifying medium is applied. In FIG. 11A, components identical to the components depicted in FIG. 9A or 10 are given the same reference numerals used in FIGS. 9A and 10 and will not again be described. As depicted in FIG. 11A, the amplifying medium 901 may be disposed in a housing 1101 disposed on the printed circuit board 911.

The amplifying medium 901 in the housing 1101 is connected to the TEC 908 through the heat pipe 1010. The portion excluding the amplifying medium 901 in the housing 1101 may be filled with a thermally insulating material 1102 such as polyurethane.

FIG. 11B is a diagram (Part II) of the second configuration example of the LD module applied to which the amplifying medium is applied. In FIG. 11B, components identical to the components depicted in FIG. 9B are given the same reference numerals used in FIG. 9B and will not again be described. In FIG. 11B, a configuration will be described that includes two LD modules 900 depicted in FIG. 11A disposed on the one printed circuit board 911.

As depicted in FIG. 11B, when the two LD modules 900 are disposed on the printed circuit board 911, each of the housings 1101 of the two modules 900 is disposed, for example, on the printed circuit board 911 between the two LD modules 900.

In the example depicted in FIG. 11B, the fixed bed 907 is omitted, and the LD 902, the PD 903, and the lenses 904 and 905 are directly disposed on the TEC 908. The heat pipe 1010 is also directly disposed on the TEC 908.

FIG. 12A is a diagram (Part I) of a third configuration example of the LD module to which the amplifying medium is applied. In FIG. 12A, components identical to the components depicted in FIG. 9A are given the same reference numerals used in FIG. 9A and will not again be described. As depicted in FIG. 12A, the amplifying medium 901 may be disposed between the housing 915 and the heat dissipating sheet 912.

The bottom face of the housing 915 is formed by the thermally conductive member such as aluminum and therefore, can thermally connect the TEC 908 and the amplifying medium 901 by connecting the TEC 908 and the amplifying medium 901 through the bottom face of the housing 915. The temperature variation of the housing 901 is gradual and therefore, the temperature of the amplifying medium 901 can be stabilized even when the amplifying medium 901 and the TEC 908 are connected through the bottom face of the housing 915.

Figure 12B:
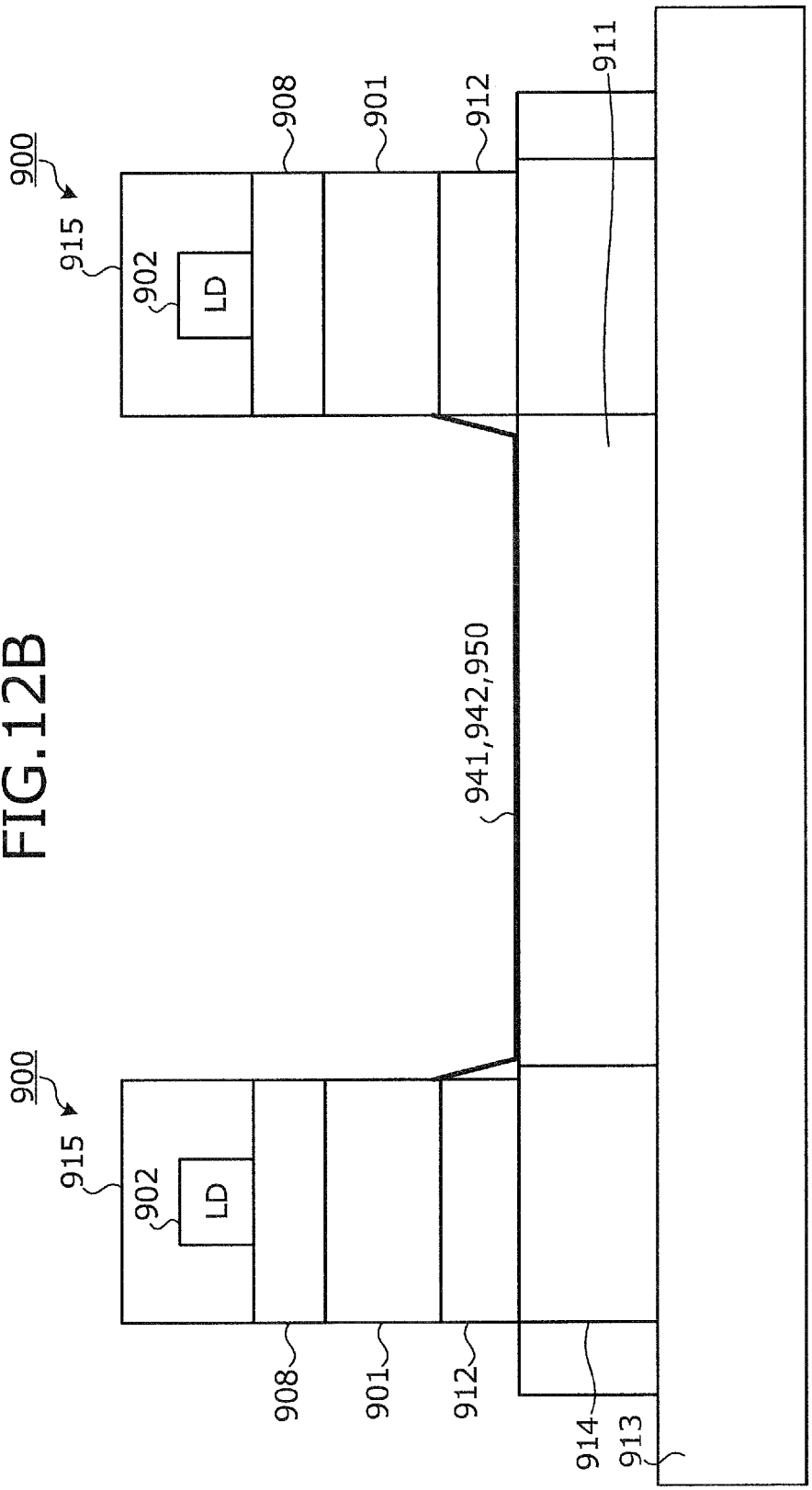
FIG. 12B is a diagram (Part II) of the third configuration example of the LD module to which the amplifying medium is applied.

FIG. 12B is a diagram (Part II) of the third configuration example of the LD module to which the amplifying medium is applied. In FIG. 12B, components identical to the components depicted in FIG. 9B are given the same reference numerals used in FIG. 9B and will not again be described. FIG. 12B depicts a configuration that includes the two LD modules 900 depicted in FIG. 12A disposed on one printed circuit board (the printed circuit board 911).

Figure 13A:
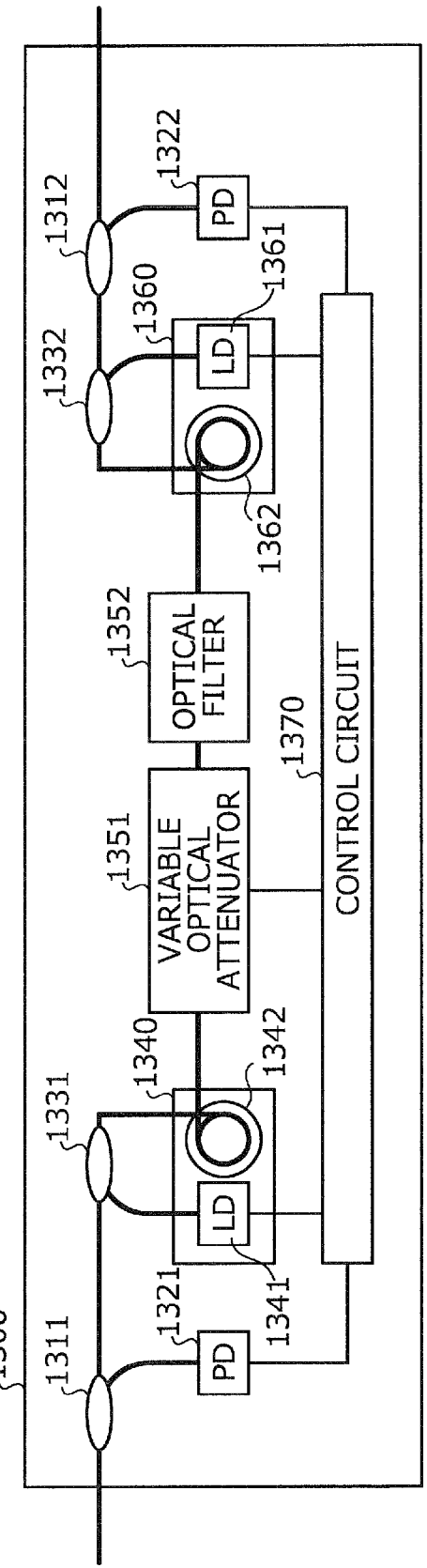
FIG. 13A is a diagram of a first example of the amplifying apparatus.
Figure 13B:
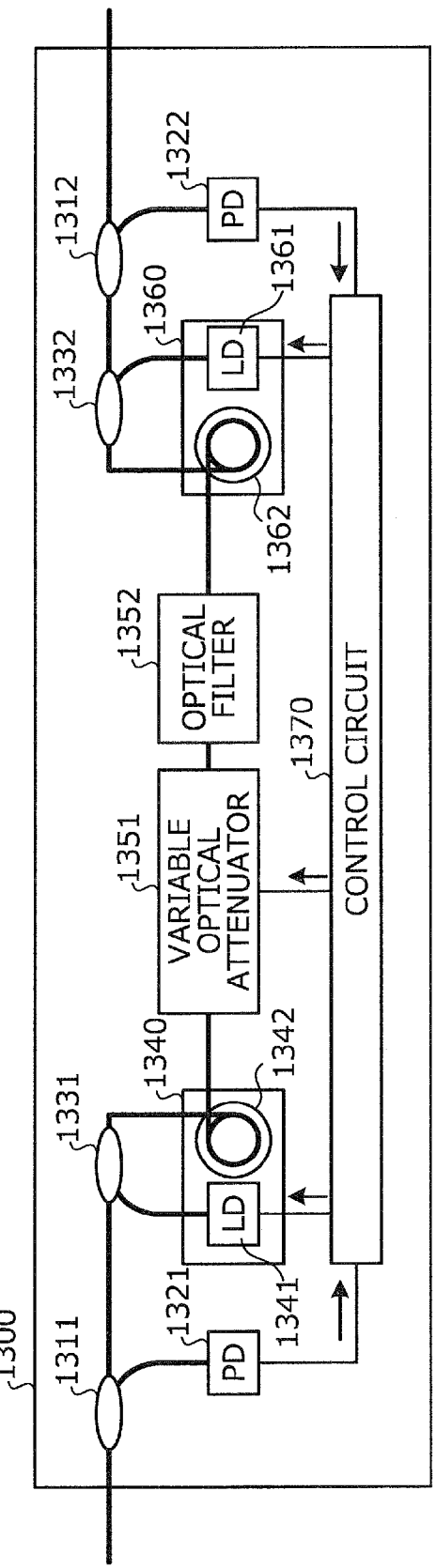
FIG. 13B is a diagram of an example of signal flow in the amplifying apparatus depicted in FIG. 13A.

FIG. 13A is a diagram of a first example of the amplifying apparatus. FIG. 13B is a diagram of an example of signal flow in the amplifying apparatus depicted in FIG. 13A. The amplifying apparatus 1300 depicted in FIGS. 13A and 13B includes branching devices 1311 and 1312, PDs 1321 and 1322, wave couplers 1331 and 1332, LD modules 1340 and 1360, a variable optical attenuator 1351, an optical filter 1352, and a control circuit 1370.

The branching device 1311 branches signal light injected into the amplifying apparatus 1300, and outputs the branched signal light to the wave coupler 1331 and the PD 1321. The wave coupler 1331 wave-couples the signal light from the branching device 1311 and excitation light output from the LD module 1340, and outputs the wave-coupled light to the LD module 1340.

The LD module 1340 includes an LD 1341 and an amplifying medium 1342. The LD 1341 generates excitation light under the control of the control circuit 1370, and outputs the generated excitation light to the wave coupler 1331. The amplifying medium 1342 transmits the light from the wave coupler 1331 and outputs the light to the variable optical attenuator 1351. For example, the LD module 730 (see, e.g., FIGS. 8A, 8B, and 10) is applicable to the LD module 1340. In this case, the LD 1341 corresponds to the LD 731 and the amplifying medium 1342 corresponds to the amplifying medium 732.

The variable optical attenuator 1351 attenuates the light from the LD module 1340 by an attenuation amount controlled by the control circuit 1370, and outputs the attenuated light to the optical filter 1352. The optical filter 1352 induces a filter property inverse to the gain property on the light from the variable optical attenuator 1351. The optical filter 1352 outputs the light to which the filter property is induced to the LD module 1360.

The LD module 1360 includes an LD 1361 and an amplifying medium 1362. The LD 1361 generates excitation light under the control from the control circuit 1370 and outputs the generated excitation light into the wave coupler 1332. The amplifying medium 1362 transmits the light from the optical filter 1352 and outputs the light to the wave coupler 1332. The amplifying medium 1362 transmits the excitation light from the wave coupler 1332 and outputs the excitation light to the optical filter 1352. For example, the LD module 730 (see, e.g., FIGS. 8A, 8B, and 10) is applicable to the LD module 1360. In this case, the LD 1361 corresponds to the LD 731 and the amplifying medium 1362 corresponds to the amplifying medium 732.

The wave coupler 1332 outputs the excitation light from the LD 1361 to the amplifying medium 1362, and outputs the light from the amplifying medium 1362 to the branching device 1312. The branching device 1312 branches the light from the wave coupler 1332 and outputs the branched light to a destination downstream from the amplifying apparatus 1300 and the PD 1322.

The PD 1321 converts the signal light from the branching device 1311 into an electronic signal and outputs the electronic signal to the control circuit 1370. The PD 1322 converts the light from the branching device 1312 into an electronic signal and outputs the electronic signal to the control circuit 1370. The control circuit 1370 executes control based on the electronic signals from the PDs 1321 and 1322.

For example, the control circuit 1370 controls the intensity of the excitation light of the LDs 1341 and 1361, the attenuation amount of the variable optical attenuator 1351, etc. For example, automatic gain control (AGC) and automatic level control (ALC) are applicable to the control executed by the control circuit 1370.

The amplifying apparatus 1300 depicted in FIGS. 13A and 13B can amplify the signal light by the forward pumping by the LD module 1340 and the backward pumping by the LD module 1360, and can emit the amplified signal light. The use of the amplifying media 1342 and 1362 as the amplifying media facilitates size reductions of the apparatus, improvement of the amplification property, and reductions in power consumption.

FIG. 14A is a diagram of a second example of the amplifying apparatus. FIG. 14B is a diagram of an example of signal flow in the amplifying apparatus depicted in FIG. 14A. In FIGS. 14A and 14B, components identical to the components depicted in FIGS. 13A and 13B are given the same reference numerals used in FIGS. 13A and 13B and will not again be described. As depicted in FIG. 14A, the amplifying apparatus 1300 may include an amplifying module 1411 instead of the wave coupler 1331 and the LD module 1340 depicted in FIGS. 13A and 13B, and may include an amplifying module 1412 instead of the wave coupler 1332 and the LD module 1360 depicted in FIGS. 13A and 13B. The configuration of each of the amplifying modules 1411 and 1412 will be described.

Figure 15A:
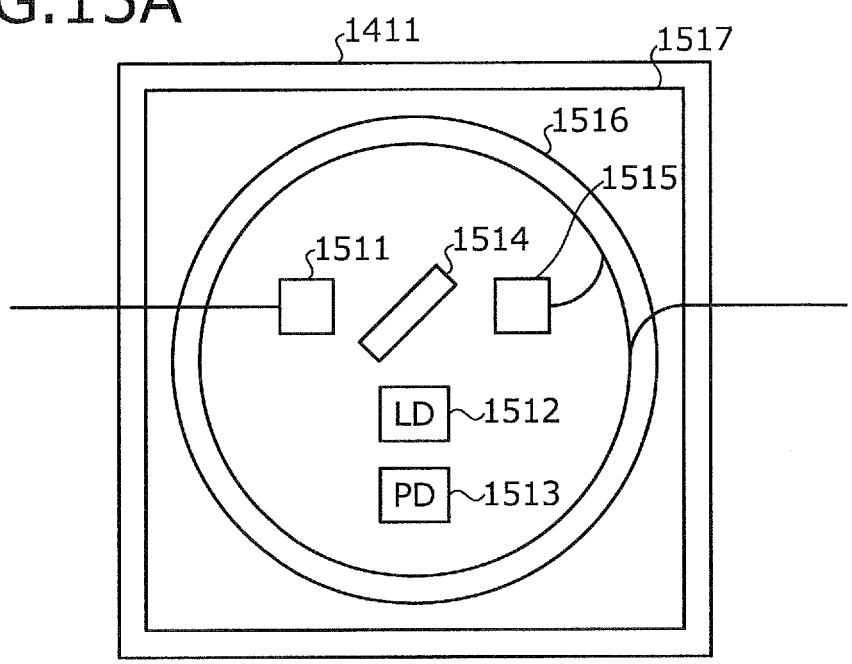
FIG. 15A is a diagram of an example of a configuration of a forward pumping amplifying module depicted in FIGS. 14A and 14B.

FIG. 15A is a diagram of an example of the configuration of the forward pumping amplifying module depicted in FIGS. 14A and 14B. As depicted in FIG. 15A, the amplifying module 1411 depicted in FIGS. 14A and 14B includes lensed fibers 1511 and 1515, an LD 1512, a PD 1513, a wave coupling film 1514, an amplifying medium 1516, and a TEC 1517. Components are disposed on the TEC 1517 such as the lensed fibers 1511 and 1515, the LD 1512, the PD 1513, the wave coupling film 1514, and the amplifying medium 1516.

The lensed fiber 1511 injects the light from the branching device 1311 (see FIGS. 14A and 14B), into the wave coupling film 1514. The LD 1512 generates excitation light under the control of the control circuit 1370 and injects the generated excitation light into the wave coupling film 1514. The PD 1513 receives the backward light of the LD 1512.

The wave coupling film 1514 wave-couples the light from the lensed fiber 1511 and the light from the LD 1512, and injects the wave-coupled light into the lensed fiber 1515. The lensed fiber 1515 injects the light from the wave-coupling film 1514, into the amplifying medium 1516. The amplifying medium 1516 transmits the light from the lensed fiber 1515 and injects the light into the variable optical attenuator 1351 (see FIGS. 14A and 14B). The amplifying medium 100 is applicable to the amplifying medium 1516. As described, from the viewpoint of the use of the light confining holey fiber 110 for coupling between modes in the amplifying medium 1516, preferably, the wave coupling film 1514 is implemented by that of the space coupling bulk type rather than that of the fiber type.

The TEC 1517 controls the temperature to be constant for the lensed fibers 1511 and 1515, the LD 1512, the PD 1513, the wave coupling film 1514, and the amplifying medium 1516. As described, the top face (a thermal coupling unit) of the TEC 1517 (a temperature adjusting unit) is thermally connected to not only the LD 1512 and the amplifying medium 1516 but also the wave coupling film 1514 (a wave coupler) and thereby, the one TEC 1517 can control the temperature of the LD 1512, the amplifying medium 1516, and the wave coupling film 1514. Thus, variation of the wave coupling property of the wave coupling film 1514 due to deformation of the wave coupling film 1514 caused by temperature variation can be suppressed.

The LD 1512 and the wave coupling film 1514 are disposed inside the wound portion 111 of the amplifying medium 1516 and thereby, size reductions of the apparatus can be facilitated. The area of the top face (the thermal coupling unit) of the TEC 1517 (the temperature adjusting unit) can be reduced and therefore, reductions in power consumption can be facilitated.

The configuration may be adapted to also implement the branching device 1311 and the PD 1321 depicted in FIGS. 13A and 13B inside the amplifying module 1411 and to collectively control the temperature thereof using the TEC 1517. In this case, preferably, the branching device 1311 is also implemented using that of the space coupling bulk type.

Figure 15B:
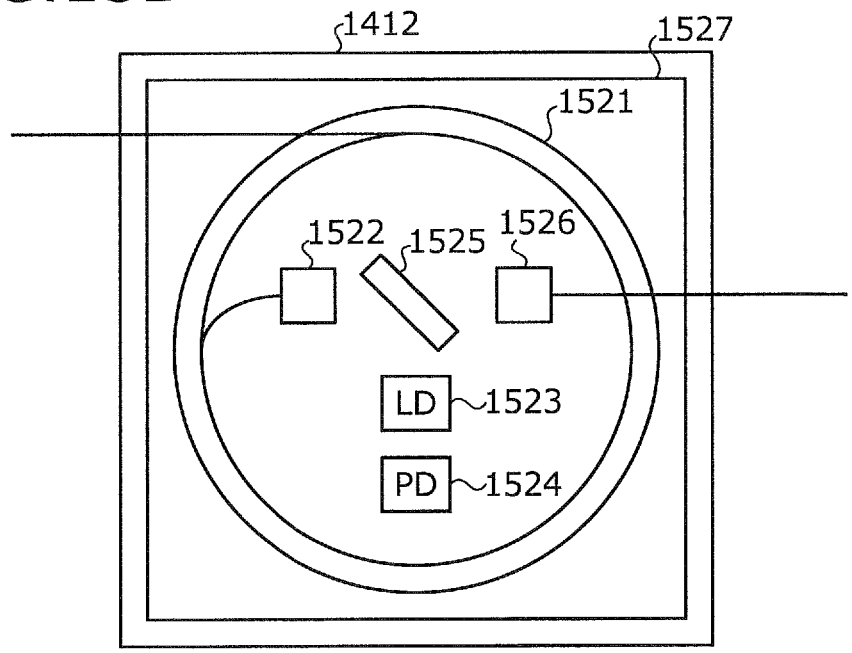
FIG. 15B is a diagram of an example of a configuration of a backward pumping amplifying module depicted in FIGS. 14A and 14B.

FIG. 15B is a diagram of an example of the configuration of the backward pumping amplifying module depicted in FIGS. 14A and 14B. As depicted in FIG. 15B, the amplifying module 1412 depicted in FIGS. 14A and 14B includes an amplifying medium 1521, lensed fibers 1522 and 1526, an LD 1523, a PD 1524, a wave coupling film 1525, and a TEC 1527. Such components are disposed on the TEC 1527 as the amplifying medium 1521, the lensed fibers 1522 and 1526, the LD 1523, the PD 1524, and the wave coupling film 1525.

The amplifying medium 1521 transmits the light from the optical filter 1352 (see FIGS. 14A and 14B) and injects the light into the lensed fiber 1522. The amplifying medium 100 is applicable to the amplifying medium 1521. The lensed fiber 1522 injects the light from the amplifying medium 1521, into the wave coupling film 1525. The LD 1523 generates excitation light under the control of the control circuit 1370 and injects the generated excitation light into the wave coupling film 1525. The PD 1524 receives the backward light of the LD 1523.

The wave coupling film 1525 wave-couples the light from the lensed fiber 1522 and the light from the LD 1523, and injects the wave-coupled light into the lensed fiber 1526. The lensed fiber 1526 injects the light from the wave coupling film 1525 into the branching device 1312 (see FIGS. 14A and 14B). As described, from the viewpoint of the use of the light confining holey fiber 110 for coupling between modes in the amplifying medium 1521, preferably, the wave coupling film 1525 is implemented by that of the space coupling bulk type rather than that of the fiber type.

The TEC 1527 controls the temperature to be constant for the amplifying medium 1521, the lensed fibers 1522 and 1526, the LD 1523, the PD 1524, and the wave coupling film 1525. As described, the top face (a thermal coupling unit) of the TEC 1527 (a temperature adjusting unit) is thermally connected to not only the LD 1523 and the amplifying medium 1521 but also the wave coupling film 1525 (a wave coupler), whereby the one TEC 1527 can control the temperature of the LD 1523, the amplifying medium 1521, and the wave coupling film 1525. Therefore, variation of the wave coupling property of the wave coupling film 1525 due to deformation of the wave coupling film 1525 caused by temperature variation can be suppressed.

The LD 1523 and the wave coupling film 1525 are disposed inside the wound portion 111 of the amplifying medium 1521, whereby size reductions of the apparatus can be facilitated. The area of the top face (the thermal coupling unit) of the TEC 1527 (the temperature adjusting unit) can be reduced and therefore, reductions in power consumption can be facilitated.

The configuration may be adapted to also implement the branching device 1312 and the PD 1322 depicted in FIGS. 13A and 13B inside the amplifying module 1412 and to collectively control the temperature thereof by the TEC 1527. In this case, preferably, the branching device 1312 is also implemented using that of the space coupling bulk type.

Figure 16:
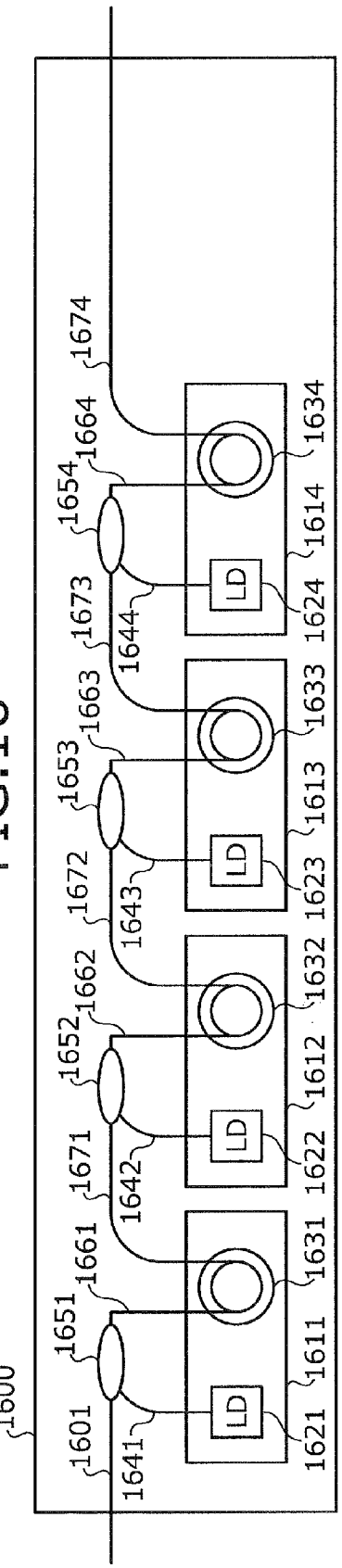
FIG. 16 is a diagram of a third example of the amplifying apparatus.

FIG. 16 is a diagram of a third example of the amplifying apparatus. The amplifying apparatus 1600 depicted in FIG. 16 includes fibers 1601, 1641 to 1644, 1661 to 1664, and 1671 to 1674, LD modules 1611 to 1614, and wave couplers 1651 to 1654.

For example, a single mode fiber (SMF) is applicable to each of the fibers 1601 and 1641 to 1644. An erbium-doped holey fiber is applicable to each of the fibers 1661 to 1664 and 1671 to 1674. The fiber 1601 injects signal light injected into the amplifying apparatus 1600, into the wave coupler 1651.

The LD module 1611 includes an LD 1621 and an amplifying medium 1631. For example, the LD module 730 (see, e.g., FIGS. 8A, 8B, and 10) is applicable to the LD module 1611. In this case, the LD 1621 corresponds to the LD 731, and the amplifying medium 1631 corresponds to the amplifying medium 732.

The LD 1621 generates excitation light and injects the generated excitation light into the fiber 1641. The fiber 1641 injects the excitation light from the LD 1621, into the wave coupler 1651. The wave coupler 1651 wave-couples the light from the fiber 1601 and the excitation light from the fiber 1641, and injects the wave-coupled light into the fiber 1661. The fiber 1661 injects the light from the wave coupler 1651 into the amplifying medium 1631. The amplifying medium 1631 transmits the light from the fiber 1661 and injects the light into the fiber 1671.

The LD module 1612 includes an LD 1622 and an amplifying medium 1632. For example, the LD module 730 (see, e.g., FIGS. 8A, 8B, and 10) is applicable to the LD module 1612. In this case, the LD 1622 corresponds to the LD 731, and the amplifying medium 1632 corresponds to the amplifying medium 732.

The LD 1622 generates excitation light and injects the generated excitation light into the fiber 1642. The fiber 1642 injects the excitation light from the LD 1622, into the wave coupler 1652. The wave coupler 1652 wave-couples the light from the fiber 1671 and the excitation light from the fiber 1642, and injects the wave-coupled light into the fiber 1662. The fiber 1662 injects the light from the wave coupler 1652 into the amplifying medium 1632. The amplifying medium 1632 transmits the light from the fiber 1662 and injects the light into the fiber 1672.

The LD module 1613 includes an LD 1623 and an amplifying medium 1633. For example, the LD module 730 (see, e.g., FIGS. 8A, 8B, and 10) is applicable to the LD module 1613. In this case, the LD 1623 corresponds to the LD 731, and the amplifying medium 1633 corresponds to the amplifying medium 732.

The LD 1623 generates excitation light and injects the generated excitation light into the fiber 1643. The fiber 1643 injects the excitation light from the LD 1623 into the wave coupler 1653. The wave coupler 1653 wave-couples the light from the fiber 1672 and the excitation light from the fiber 1643 and injects the wave-coupled light into the fiber 1663. The fiber 1663 injects the light from the wave coupler 1653 into the amplifying medium 1633. The amplifying medium 1633 transmits the light from the fiber 1663 and injects the light into the fiber 1673.

The LD module 1614 includes an LD 1624 and an amplifying medium 1634. For example, the LD module 730 (see, e.g., FIGS. 8A, 8B, and 10) is applicable to the LD module 1614. In this case, the LD 1624 corresponds to the LD 731, and the amplifying medium 1634 corresponds to the amplifying medium 732.

The LD 1624 generates excitation light and injects the generated excitation light into the fiber 1644. The fiber 1644 injects the excitation light from the LD 1624 into the wave coupler 1654. The wave coupler 1654 wave-couples the light from the fiber 1673 and the excitation light from the fiber 1644 and injects the wave-coupled light into the fiber 1664. The fiber 1664 injects the light from the wave coupler 1654 into the amplifying medium 1634. The amplifying medium 1634 transmits the light from the fiber 1664 and injects the light into the fiber 1674.

The fiber 1674 injects the light injected thereinto, into the post-stage of the amplifying apparatus 1600 as a light formed by amplifying the signal light injected into the amplifying apparatus 1600. As depicted in FIG. 16, even when the amplifiers are formed in multiple tiers (four tiers in the example depicted in FIG. 16), size reductions of the apparatus, improvement of the amplification property, and reductions in power consumption can be facilitated by applying, for example, the LD module 730 to each of the amplifiers.

As described, according to the amplifying apparatus and the amplifying medium, size reductions of the apparatus can be facilitated. For example, in the above '794 Publication, when one Peltier device tries to adjust the temperature of the excitation LD and that of the amplifying medium, the area of the amplifying medium is large and therefore, the size of the Peltier device also becomes large. Consequently, the size of the apparatus becomes large. In contrast, the use of the amplifying medium 100 enables reduction of the size of the Peltier device and therefore, size reductions of the apparatus can be facilitated.

Simplification of the control, reductions in power consumption, cost, and size can be facilitated compared to a case where a variable gain equalizer of a type such as an acousto-optic tunable filter (AOTF) type or a magneto-optical effect type is used to cancel the temperature property of the gain of the optical amplifying medium.

The embodiment is applicable to an erbium doped waveguide amplifier (EDWA).

FIG. 17A is a diagram of an example of an amplifier implemented by a holey fiber. The holey fiber 1700 depicted in FIG. 17A is a holey fiber whose core is doped with erbium. Clad-removed portions 1711 to 1714 whose cladding portions are removed are disposed in an input-side portion 1701, among the input-side portion 1701 and an output-side portion 1702 of the holey fiber 1700.

Fibers 1731 to 1734 are fusion-spliced to the cladding-removed portions 1711 to 1714. Excitation light from LDs 1721 to 1724 is respectively injected into the cladding-removed portions 1711 to 1714 through the fibers 1731 to 1734. Thereby, the signal light passing through the holey fiber 1700 is amplified by induced emission.

FIG. 17B is a diagram of an example of a fusion-spliced portion of the holey fiber depicted in FIG. 17A. The fusion-spliced portion between the cladding-removed portion 1711 and the fiber 1731 will be described with reference to FIG. 17B. However, the fusion-spliced portions between the cladding-removed portions 1712 to 1714 and the fibers 1732 to 1734 are each same as described below. An adjacency distance "d" represents the distance between the cladding-removed portion 1711 and the fiber 1731 in the portion for the cladding-removed portion 1711 and the fiber 1731 to be adjacent to each other. An introduction length "L" represents the length of the portion for the cladding-removed portion 1711 and the fiber 1731 to be adjacent to each other.

As depicted in FIG. 17B, by causing the cladding-removed portion 1711 and the fiber 1731 to be adjacent to each other, the light that passes through the cladding-removed portion 1711 and the fiber 1731 are wave-coupled by mode coupling. Thus, the excitation light can be injected into the holey fiber 1700.

FIG. 17C is a cross-sectional diagram of the holey fiber depicted in FIG. 17A. As depicted in FIG. 17C, the holey fiber 1700 includes a core 1751, a cladding 1752, and a covering portion 1753. The core 1751 is a high refractive index portion whose reflective index is higher than that of the fiber 1731. The core 1751 is doped with erbium. For example, the core diameter of the core 1751 may be set to be 10 [μm].

The cladding 1752 is a low refractive index portion whose reflective index is lower than that of the core 1751. The cladding diameter of the cladding 1752 may be set to be, for example, 125 [μm]. The cladding 1752 has holes 1741 to 1746 disposed therein surrounding the core 1751. The hole diameter of each of the holes 1741 to 1746 may be set to be, for example, 6 to 8 [μm].

The holey fiber 1700 depicted in FIGS. 17A to 17C is applicable to, for example, a light source for a digital versatile disc (DVD) that uses a 0.65 [μm]-band that is one of plural excitation wavelength bands for the EDF. The excitation light source of an optical fiber amplifier only has to increase the energy level of the rare earth ion. However, when the light source for the DVD is used as the excitation light source, a problem arises in that the optical output power of the light source for the DVD is too low and the quality of the NF thereof is relatively low.

Therefore, the excitation efficiency is improved utilizing the high confinement property of the holey fiber and thereby, the light source is caused to be usable even with the low excitation light power. The NF can be improved by forming an excitation structure by removing the cladding having the covering and the holey portion for each of the plural points of the input-side portion 1701 of the EDF in a longitudinal direction influencing the NF, and connecting an optical fiber to inject the excitation light into each of the points.

When the holey fiber 1700 is applied to an optical amplifying fiber, not only the effect is achieved that any increase of the insertion loss is avoided by suppressing the radiation mode utilizing the high optical confinement property of the holey fiber but also another effect is achieved that any shift of the 0.65 [μm]-excitation light to multiple-mode light can be suppressed. An effect that the cutoff wavelength is reduced by reducing the core diameter can be equivalently achieved.

The reliability can be improved by applying many 0.65 [μm]-LDs 1721 to 1724 like the holey fiber 1700. By employing a configuration adapted to, cover a faulted LD using another LD when any one of the LDs 1721 to 1724 is faulted, the inexpensive and low output power 0.65 [μm]-excitation LDs can be used effectively.

For a Raman amplifier, it is required that the excitation wavelength of the excitation light source does not fluctuate and is constant to maintain stable amplification properties (the gain, the noise). Therefore, according to a known technique, a fiber grating (fiber Bragg grating (FBG)) is disposed in a portion of an output fiber of the LD module generating the excitation light; light having a specific wavelength is reflected at a low reflection rate; and the laser oscillation wavelength is fixed at the specific wavelength.

However, it is considered that the intervals of the diffraction grating of this fiber grating vary due to variation of the environmental temperature and the wavelength of the light reflected at the low reflection rate varies by about several [nm]. Thereby, the excitation wavelength varies by about several [nm] and therefore, it is difficult to maintain the predetermined stable amplification properties (the gain, the noise). To solve this, according to the conventional technique, a wide portion including the fiber grating portion is coated with a thermally insulating material such that the fiber grating is not affected by the temperature. Therefore, a problem arises in that this coating leads to increases in the size and the cost of the apparatus.

Figure 18:
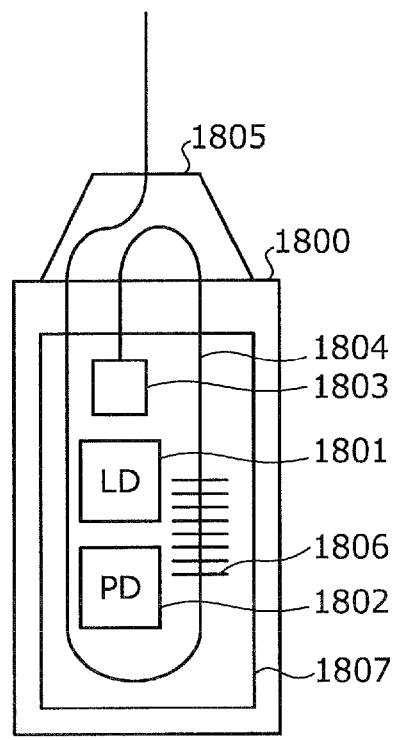
FIG. 18 is a diagram of an example of excitation light source for a Raman amplifier.

FIG. 18 is a diagram of an example of the excitation light source for the Raman amplifier. The excitation light source 1800 depicted in FIG. 18 includes an LD 1801, a PD 1802, a lensed fiber 1803, a fiber 1804, an injecting unit 1805, and a TEC 1807.

The LD 1801 generates and outputs excitation light. The PD 1802 receives the backward light of the LD 1801. The lensed fiber 1803 injects the excitation light from the LD 1801 into the fiber 1804. The fiber 1804 is an optical fiber having plural holes in the cladding; is, for example, a holey fiber; and injects the excitation light from the lensed fiber 1803 into the injecting unit 1805. The injecting unit 1805 outputs the excitation light from the fiber 1804.

A fiber grating 1806 is disposed in the fiber 1804. Thereby, light of a specific wavelength among the excitation light injected thereinto from the LD 1801 is reflected at a low reflection rate, and the oscillation wavelength of the LD 1801 is fixed at the specific wavelength.

The portions of the fiber grating 1806 of the LD 1801, the PD 1802, the lensed fiber 1803, and the fiber 1804 are disposed on the TEC 1807. The TEC 1807 collectively controls the temperature of the portions of the fiber grating 1806 of the LD 1801, the PD 1802, the lensed fiber 1803, and the fiber 1804.

As described, the use of the holey fiber as the fiber 1804 guiding the output light of the LD 1801 enables the fiber 1804 to be bent with a small diameter and therefore, the interval between the LD 1801 and the fiber grating 1806 can be reduced. As a result, the TEC 1807 can collectively control the temperature of the LD 1801 and the fiber grating 1806.

Thus, even when the wide portion of the fiber grating 1806 is not coated with the thermally insulating material or a TEC other than the TEC 1807 does not control the temperature of the fiber grating 1806, the oscillation wavelength of the LD 1801 can be stabilized. Therefore, size reductions of the apparatus and reductions in power consumption can be facilitated stabilizing the wavelength of the excitation light of the excitation light source 1800.

Figure 19:
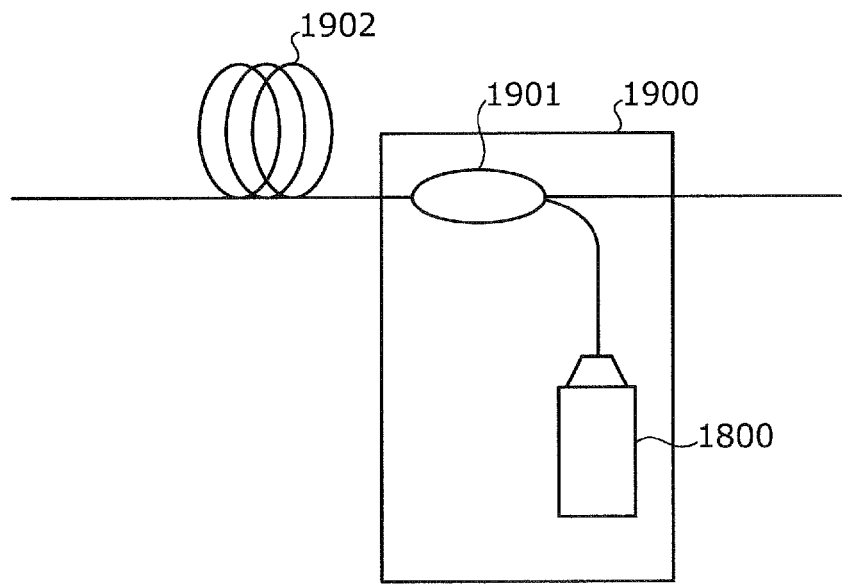
FIG. 19 is a diagram of an example of the Raman amplifier to which the excitation light source depicted in FIG. 18 is applied.

FIG. 19 is a diagram of an example of the Raman amplifier to which the excitation light source depicted in FIG. 18 is applied. The Raman amplifier 1900 depicted in FIG. 19 includes the excitation light source 1800 depicted in FIG. 18 and a wave-coupler 1901. The excitation light source 1800 injects excitation light into the wave-coupler 1901.

The wave-coupler 1901 outputs signal light from the fiber 1902 upstream from the wave coupler 1901, to a destination downstream; and outputs the excitation light from the excitation light source 1800, to the fiber 1902. Thereby, the signal light passing through the fiber 1902 can be amplified. The description has only been made taking an example of the backward distribution Raman amplifier that excites from the back with reference to FIG. 19, and this description is further applicable to both of a forward excitation distribution Raman amplifier and a bidirectional excitation distribution Raman amplifier.

As described, with the excitation light source 1800, the excitation wavelength is stabilized; and size reductions of the apparatus and reductions in power consumption can be facilitated. Consequently, improvement of the amplification property of the Raman amplifier 1900, size reductions of the apparatus, and reductions in power consumption can be facilitated.

According to an aspect of the embodiments, reductions in the size of the apparatus is facilitated.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifying apparatus comprising:
   an optical fiber including a wound portion doped with a rare earth element and holes being formed in a cladding of the optical fiber and surrounding a core of the optical fiber, the wound portion being three-dimensionally wound and including a first wound portion and a second wound portion wound inside the first wound portion, the wound portion being formed such that a winding direction of the first wound portion and a winding direction of the second wound portion differ from each other by 90°, the optical fiber transmitting signal light injected thereinto;
   a thermally conductive member in which the wound portion of the optical fiber is embedded, the thermally conductive member having thermal conductivity;
   a light source emitting excitation light;
   an injecting unit injecting the excitation light emitted by the light source, into the optical fiber; and
   a temperature adjusting unit including a thermal coupling unit thermally connected to the light source and the thermally conductive member, the temperature adjusting unit adjusting a temperature of the thermal coupling unit.

2. The amplifying apparatus according to claim 1, wherein the thermally conductive member is formed by silicon resin.

3. The amplifying apparatus according to claim 1, wherein the optical fiber is a hole-assisted holey fiber.

4. The amplifying apparatus according to claim 1, further comprising
   a housing that seals the wound portion of the optical fiber, and includes a thermally conducting unit that thermally connects an interior and an exterior of the housing, wherein
   the thermally conductive member is filled inside the housing, and
   the thermal coupling unit of the temperature adjusting unit is thermally connected to the thermally conductive member through the thermally conducting unit.

5. The amplifying apparatus according to claim 1, wherein the injecting unit is a wave coupler that wave-couples the excitation light and the injected signal light and injects the wave-coupled light into the optical fiber.

6. The amplifying apparatus according to claim 5, wherein the thermal coupling unit of the temperature adjusting unit is thermally connected to the wave coupler.

7. The amplifying apparatus according to claim 6, wherein the light source and the wave coupler are disposed inside the wound portion of the optical fiber.

8. The amplifying apparatus according to claim 1, wherein the injecting unit is a wave coupler that injects the excitation light into the optical fiber in a direction opposite to a direction of the signal light and that outputs the signal light passing through the optical fiber.

9. The amplifying apparatus according to claim 8, wherein the thermal coupling unit of the temperature adjusting unit is thermally connected to the wave coupler.

10. The amplifying apparatus according to claim 9, wherein the light source and the wave coupler are disposed inside the wound portion of the optical fiber.

11. The amplifying apparatus according to claim 1, further comprising:
- first and second optical fibers;
- first and second thermally conductive members;
- first and second light sources;
- first and second injecting units; and
- first and second temperature adjusting units, wherein
- an output end of the second optical fiber is connected to an input end of the first optical fiber,
- the first thermally conductive member has the wound portion of the first optical fiber embedded therein,
- the second thermally conductive member has the wound portion of the second optical fiber embedded therein,
- the first injecting unit wave-couples excitation light injected thereinto by the first light source and the signal light injected thereinto, and injects wave-coupled light into the input end of the first optical fiber,
- the second injecting unit injects the excitation light injected thereinto by the second light source into the input end of the first optical fiber in a direction opposite to a direction of the signal light, and outputs the signal light injected thereinto from an output end of the first optical fiber,
- a thermal coupling unit of the first temperature adjusting unit is thermally connected to the first light source and the first thermally conductive member, and
- a thermal coupling unit of the second temperature adjusting unit is thermally connected to the second light source and the second thermally conductive member.

12. An amplifying apparatus comprising:
- an optical fiber including a wound portion doped with a rare earth element and holes being formed in a cladding of the optical fiber and surrounding a core of the optical fiber, the wound portion being three-dimensionally wound and including a first wound portion and a second wound portion wound inside the first wound portion, the wound portion being formed such that a winding direction of the first wound portion and a winding direction of the second wound portion differ from each other by 90°, the optical fiber transmitting signal light injected thereinto;
- a housing sealing the wound portion of the optical fiber, the housing including a thermally conducting unit thermally connecting an interior and an exterior of the housing;
- a light source emitting excitation light;
- an injecting unit injecting the excitation light injected thereinto by the light source, into the optical fiber; and
- a temperature adjusting unit including a thermal coupling unit thermally connected to the light source and the thermally conducting unit, the temperature adjusting unit adjusting a temperature of the thermal coupling unit.

* * * * *